(12) United States Patent
Padhi et al.

(10) Patent No.: US 7,205,228 B2
(45) Date of Patent: Apr. 17, 2007

(54) SELECTIVE METAL ENCAPSULATION SCHEMES

(75) Inventors: Deenesh Padhi, Santa Clara, CA (US);
Srinivas Gandikota, Santa Clara, CA (US); Mehul Naik, San Jose, CA (US);
Suketu A. Parikh, San Jose, CA (US);
Girish A. Dixit, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/812,480

(22) Filed: Mar. 30, 2004

(65) Prior Publication Data

US 2004/0248409 A1    Dec. 9, 2004

Related U.S. Application Data

(60) Provisional application No. 60/475,351, filed on Jun. 3, 2003.

(51) Int. Cl.
*H01L 21/44* (2006.01)

(52) U.S. Cl. .................. 438/652; 438/670; 438/678

(58) Field of Classification Search ........... 438/670, 438/652–654, 642–644, 678; 257/E21.025, 257/E21.034
See application file for complete search history.

(56) References Cited

U.S. PATENT DOCUMENTS

| | | | |
|---|---|---|---|
| 3,205,485 A | | 9/1965 | Noltingk |
| 3,229,198 A | | 1/1966 | Libby |
| 3,767,900 A | | 10/1973 | Chao et al. |
| 3,839,067 A | * | 10/1974 | Sosnowski et al. ......... 427/164 |
| 3,873,361 A | * | 3/1975 | Franco et al. ............... 430/324 |
| 3,920,965 A | | 11/1975 | Sohrwardy |
| 3,982,943 A | * | 9/1976 | Feng et al. .................. 430/312 |
| 4,000,458 A | | 12/1976 | Miller et al. |
| 4,004,044 A | * | 1/1977 | Franco et al. .......... 204/192.32 |

(Continued)

FOREIGN PATENT DOCUMENTS

CA        2050247        8/1991

(Continued)

OTHER PUBLICATIONS

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

(Continued)

*Primary Examiner*—Lex H. Malasawma
(74) *Attorney, Agent, or Firm*—WilmerHale

(57) ABSTRACT

A method and system of processing a semiconductor substrate includes, in one or more embodiments, depositing a protective layer on the substrate surface comprising a conductive element disposed in a dielectric material; processing the protective layer to expose the conductive element; electrolessly depositing a metallic passivating layer onto the conductive element; and removing at least a portion of the protective layer from the substrate after electroless deposition. In another aspect, a method and system of processing a semiconductor includes depositing a metallic passivating layer onto a substrate surface comprising a conductive element, masking the passivating layer to protect the underlying conductive element of the substrate surface, removing the unmasked passivating layer, and removing the mask from the passivating layer.

33 Claims, 6 Drawing Sheets

U.S. PATENT DOCUMENTS

| | | | |
|---|---|---|---|
| 4,090,006 A * | 5/1978 | Havas et al. ................... 428/81 |
| 4,207,520 A | 6/1980 | Flora et al. |
| 4,209,744 A | 6/1980 | Gerasimov et al. |
| 4,302,721 A | 11/1981 | Urbanek et al. |
| 4,339,305 A * | 7/1982 | Jones ........................... 216/18 |
| 4,368,510 A | 1/1983 | Anderson |
| 4,609,870 A | 9/1986 | Lale et al. |
| 4,616,308 A | 10/1986 | Morshedi et al. |
| 4,639,380 A * | 1/1987 | Amelio et al. ............. 427/98.1 |
| 4,663,703 A | 5/1987 | Axelby et al. |
| 4,698,766 A | 10/1987 | Entwistle et al. |
| 4,750,141 A | 6/1988 | Judell et al. |
| 4,755,753 A | 7/1988 | Chern |
| 4,757,259 A | 7/1988 | Charpentier |
| 4,796,194 A | 1/1989 | Atherton |
| 4,901,218 A | 2/1990 | Cornwell |
| 4,938,600 A | 7/1990 | Into |
| 4,954,218 A * | 9/1990 | Okumura et al. ........... 438/439 |
| 4,957,605 A | 9/1990 | Hurwitt et al. |
| 4,967,381 A | 10/1990 | Lane et al. |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,262,354 A * | 11/1993 | Cote et al. .................... 216/18 |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,656,128 A * | 8/1997 | Hashimoto et al. ........... 216/47 |
| 5,657,254 A | 8/1997 | Sierk et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,686,325 A * | 11/1997 | Moriuchi et al. ........... 438/571 |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,002,989 A | 12/1999 | Shiba et al. |

| | | | | | | |
|---|---|---|---|---|---|---|
| 6,012,048 A | 1/2000 | Gustin et al. | | 6,277,014 B1 | 8/2001 | Chen et al. |
| 6,017,771 A | 1/2000 | Yang et al. | | 6,278,899 B1 | 8/2001 | Piche et al. |
| 6,036,349 A | 3/2000 | Gombar | | 6,280,289 B1 | 8/2001 | Wiswesser et al. |
| 6,037,664 A | 3/2000 | Zhao et al. | | 6,281,127 B1 | 8/2001 | Shue |
| 6,041,263 A | 3/2000 | Boston et al. | | 6,284,622 B1 | 9/2001 | Campbell et al. |
| 6,041,270 A | 3/2000 | Steffan et al. | | 6,287,879 B1 | 9/2001 | Gonzales et al. |
| 6,054,379 A | 4/2000 | Yau et al. | | 6,290,572 B1 | 9/2001 | Hofmann |
| 6,059,636 A | 5/2000 | Inaba et al. | | 6,291,367 B1 | 9/2001 | Kelkar |
| 6,064,759 A | 5/2000 | Buckley et al. | | 6,292,708 B1 | 9/2001 | Allen et al. |
| 6,072,313 A | 6/2000 | Li et al. | | 6,298,274 B1 | 10/2001 | Inoue |
| 6,074,443 A | 6/2000 | Venkatesh et al. | | 6,298,470 B1 | 10/2001 | Breiner et al. |
| 6,077,412 A | 6/2000 | Ting et al. | | 6,303,395 B1 | 10/2001 | Nulman |
| 6,078,845 A | 6/2000 | Friedman | | 6,303,500 B1 * | 10/2001 | Jiang et al. ............... 438/678 |
| 6,094,688 A | 7/2000 | Mellen-Garnett et al. | | 6,304,999 B1 | 10/2001 | Toprac et al. |
| 6,096,649 A | 8/2000 | Jang | | 6,307,628 B1 | 10/2001 | Lu et al. |
| 6,097,887 A | 8/2000 | Hardikar et al. | | 6,314,379 B1 | 11/2001 | Hu et al. |
| 6,100,195 A | 8/2000 | Chan et al. | | 6,317,643 B1 | 11/2001 | Dmochowski |
| 6,108,092 A | 8/2000 | Sandhu | | 6,320,655 B1 | 11/2001 | Matsushita et al. |
| 6,111,634 A | 8/2000 | Pecen et al. | | 6,324,481 B1 | 11/2001 | Atchison et al. |
| 6,112,130 A | 8/2000 | Fukuda et al. | | 6,334,807 B1 | 1/2002 | Lebel et al. |
| 6,113,462 A | 9/2000 | Yang | | 6,336,841 B1 | 1/2002 | Chang |
| 6,114,238 A | 9/2000 | Liao | | 6,339,727 B1 | 1/2002 | Ladd |
| 6,127,263 A | 10/2000 | Parikh | | 6,340,602 B1 | 1/2002 | Johnson et al. |
| 6,128,016 A | 10/2000 | Coelho et al. | | 6,345,288 B1 | 2/2002 | Reed et al. |
| 6,136,163 A | 10/2000 | Cheung et al. | | 6,345,315 B1 | 2/2002 | Mishra |
| 6,141,660 A | 10/2000 | Bach et al. | | 6,346,426 B1 | 2/2002 | Toprac et al. |
| 6,143,646 A | 11/2000 | Wetzel | | 6,355,559 B1 | 3/2002 | Havemann et al. |
| 6,148,099 A | 11/2000 | Lee et al. | | 6,360,133 B1 | 3/2002 | Campbell et al. |
| 6,148,239 A | 11/2000 | Funk et al. | | 6,360,184 B1 | 3/2002 | Jacquez |
| 6,148,246 A | 11/2000 | Kawazome | | 6,363,294 B1 | 3/2002 | Coronel et al. |
| 6,150,270 A | 11/2000 | Matsuda et al. | | 6,366,934 B1 | 4/2002 | Cheng et al. |
| 6,157,864 A | 12/2000 | Schwenke et al. | | 6,368,879 B1 | 4/2002 | Toprac |
| 6,159,075 A | 12/2000 | Zhang | | 6,368,883 B1 | 4/2002 | Bode et al. |
| 6,159,644 A | 12/2000 | Satoh et al. | | 6,368,884 B1 | 4/2002 | Goodwin et al. |
| 6,161,054 A | 12/2000 | Rosenthal et al. | | 6,379,980 B1 | 4/2002 | Toprac |
| 6,169,931 B1 | 1/2001 | Runnels | | 6,381,564 B1 | 4/2002 | Davis et al. |
| 6,172,756 B1 | 1/2001 | Chalmers et al. | | 6,388,253 B1 | 5/2002 | Su |
| 6,173,240 B1 | 1/2001 | Sepulveda et al. | | 6,389,491 B1 | 5/2002 | Jacobson et al. |
| 6,175,777 B1 | 1/2001 | Kim | | 6,391,780 B1 | 5/2002 | Shih et al. |
| 6,178,390 B1 | 1/2001 | Jun | | 6,395,152 B1 | 5/2002 | Wang |
| 6,181,013 B1 | 1/2001 | Liu et al. | | 6,397,114 B1 | 5/2002 | Eryurek et al. |
| 6,183,345 B1 | 2/2001 | Kamono et al. | | 6,400,162 B1 | 6/2002 | Mallory et al. |
| 6,185,324 B1 | 2/2001 | Ishihara et al. | | 6,405,096 B1 | 6/2002 | Toprac et al. |
| 6,191,864 B1 | 2/2001 | Sandhu | | 6,405,144 B1 | 6/2002 | Toprac et al. |
| 6,192,291 B1 | 2/2001 | Kwon | | 6,417,014 B1 | 7/2002 | Lam et al. |
| 6,197,604 B1 | 3/2001 | Miller et al. | | 6,426,289 B1 * | 7/2002 | Farrar ........................ 438/670 |
| 6,204,165 B1 | 3/2001 | Ghoshal | | 6,427,093 B1 | 7/2002 | Toprac |
| 6,210,983 B1 | 4/2001 | Atchison et al. | | 6,432,728 B1 | 8/2002 | Tai et al. |
| 6,211,094 B1 | 4/2001 | Jun et al. | | 6,435,952 B1 | 8/2002 | Boyd et al. |
| 6,212,961 B1 | 4/2001 | Dvir | | 6,438,438 B1 | 8/2002 | Takagi et al. |
| 6,214,734 B1 | 4/2001 | Bothra et al. | | 6,440,295 B1 | 8/2002 | Wang |
| 6,217,412 B1 | 4/2001 | Campbell et al. | | 6,442,496 B1 | 8/2002 | Pasadyn et al. |
| 6,219,711 B1 | 4/2001 | Chari | | 6,449,524 B1 | 9/2002 | Miller et al. |
| 6,222,936 B1 | 4/2001 | Phan et al. | | 6,455,415 B1 | 9/2002 | Lopatin et al. |
| 6,226,563 B1 | 5/2001 | Lim | | 6,455,937 B1 | 9/2002 | Cunningham |
| 6,226,792 B1 | 5/2001 | Goiffon et al. | | 6,465,263 B1 | 10/2002 | Coss, Jr. et al. |
| 6,228,280 B1 | 5/2001 | Li et al. | | 6,470,230 B1 | 10/2002 | Toprac et al. |
| 6,230,069 B1 | 5/2001 | Campbell et al. | | 6,479,902 B1 * | 11/2002 | Lopatin et al. .............. 257/774 |
| 6,236,903 B1 | 5/2001 | Kim et al. | | 6,479,990 B2 | 11/2002 | Mednikov et al. |
| 6,237,050 B1 | 5/2001 | Kim et al. | | 6,482,660 B2 | 11/2002 | Conchieri et al. |
| 6,240,330 B1 | 5/2001 | Kurtzberg et al. | | 6,484,064 B1 | 11/2002 | Campbell |
| 6,240,331 B1 | 5/2001 | Yun | | 6,486,492 B1 | 11/2002 | Su |
| 6,245,581 B1 | 6/2001 | Bonser et al. | | 6,492,281 B1 | 12/2002 | Song et al. |
| 6,246,972 B1 | 6/2001 | Klimasauskas | | 6,495,452 B1 | 12/2002 | Shih |
| 6,248,602 B1 | 6/2001 | Bode et al. | | 6,503,839 B1 | 1/2003 | Gonzales et al. |
| 6,249,712 B1 | 6/2001 | Boiquaye | | 6,515,368 B1 | 2/2003 | Lopatin et al. |
| 6,252,412 B1 | 6/2001 | Talbot et al. | | 6,517,413 B1 | 2/2003 | Hu et al. |
| 6,253,366 B1 | 6/2001 | Mutschler, III | | 6,517,414 B1 | 2/2003 | Tobin et al. |
| 6,259,160 B1 | 7/2001 | Lopatin et al. | | 6,528,409 B1 | 3/2003 | Lopatin et al. |
| 6,263,255 B1 | 7/2001 | Tan et al. | | 6,529,789 B1 | 3/2003 | Campbell et al. |
| 6,268,270 B1 | 7/2001 | Scheid et al. | | 6,532,555 B1 | 3/2003 | Miller et al. |
| 6,271,670 B1 | 8/2001 | Caffey | | 6,535,783 B1 | 3/2003 | Miller et al. |
| 6,276,989 B1 | 8/2001 | Campbell et al. | | 6,537,912 B1 | 3/2003 | Agarwal |

| | | | | | |
|---|---|---|---|---|---|
| 6,540,591 B1 | 4/2003 | Pasadyn et al. | EP | 0 747 795 A2 | 12/1996 |
| 6,541,401 B1 | 4/2003 | Herner et al. | EP | 0 869 652 A2 | 10/1998 |
| 6,546,508 B1 | 4/2003 | Sonderman et al. | EP | 0 877 308 A2 | 11/1998 |
| 6,556,881 B1 | 4/2003 | Miller | EP | 0 881 040 A2 | 12/1998 |
| 6,560,504 B1 | 5/2003 | Goodwin et al. | EP | 0 895 145 A1 | 2/1999 |
| 6,563,308 B2 | 5/2003 | Nagano et al. | EP | 0 910 123 A1 | 4/1999 |
| 6,567,717 B2 | 5/2003 | Krivokapic et al. | EP | 0 932 194 A1 | 7/1999 |
| 6,580,958 B1 | 6/2003 | Takano | EP | 0 932 195 A1 | 7/1999 |
| 6,587,744 B1 | 7/2003 | Stoddard et al. | EP | 1 066 925 A2 | 1/2001 |
| 6,590,179 B2 | 7/2003 | Tanaka et al. | EP | 1 067 757 A1 | 1/2001 |
| 6,604,012 B1 | 8/2003 | Cho et al. | EP | 1 071 128 A2 | 1/2001 |
| 6,605,549 B2 | 8/2003 | Leu et al. | EP | 1 083 470 A2 | 3/2001 |
| 6,607,976 B2 | 8/2003 | Chen et al. | EP | 1 092 505 A2 | 4/2001 |
| 6,609,946 B1 | 8/2003 | Tran | EP | 1 072 967 A3 | 11/2001 |
| 6,616,513 B1 | 9/2003 | Osterheld | EP | 1 182 526 A2 | 2/2002 |
| 6,618,692 B2 | 9/2003 | Takahashi et al. | GB | 2 347 885 A | 9/2000 |
| 6,624,075 B1 | 9/2003 | Lopatin et al. | GB | 2 365 215 A | 2/2002 |
| 6,625,497 B2 | 9/2003 | Fairbairn et al. | JP | 61-66104 | 4/1986 |
| 6,630,741 B1 | 10/2003 | Lopatin et al. | JP | 61-171147 | 8/1986 |
| 6,640,151 B1 | 10/2003 | Somekh et al. | JP | 62172741 A * | 7/1987 |
| 6,652,355 B2 | 11/2003 | Wiswesser et al. | JP | 01-283934 | 11/1989 |
| 6,660,633 B1 | 12/2003 | Lopatin et al. | JP | 3-202710 | 9/1991 |
| 6,678,570 B1 | 1/2004 | Pasadyn et al. | JP | 05-151231 | 6/1993 |
| 6,708,074 B1 | 3/2004 | Chi et al. | JP | 05-216896 | 8/1993 |
| 6,708,075 B2 | 3/2004 | Sonderman et al. | JP | 05-266029 | 10/1993 |
| 6,713,377 B2 * | 3/2004 | Lee et al. .................. 438/614 | JP | 06-110894 | 4/1994 |
| 6,725,402 B1 | 4/2004 | Coss, Jr. et al. | JP | 06-176994 | 6/1994 |
| 6,728,587 B2 | 4/2004 | Goldman et al. | JP | 06-184434 | 7/1994 |
| 6,735,492 B2 | 5/2004 | Conrad et al. | JP | 06-252236 | 9/1994 |
| 6,751,518 B1 | 6/2004 | Sonderman et al. | JP | 06-260380 | 9/1994 |
| 6,774,998 B1 | 8/2004 | Wright et al. | JP | 8-23166 | 1/1996 |
| 6,911,400 B2 * | 6/2005 | Colburn et al. ............. 438/758 | JP | 08-50161 | 2/1996 |
| 2001/0001755 A1 | 5/2001 | Sandhu et al. | JP | 08-149583 | 6/1996 |
| 2001/0003084 A1 | 6/2001 | Finarov | JP | 08-304023 | 11/1996 |
| 2001/0006873 A1 | 7/2001 | Moore | JP | 09-34535 | 2/1997 |
| 2001/0030366 A1 | 10/2001 | Nakano et al. | JP | 9-246547 | 9/1997 |
| 2001/0039462 A1 | 11/2001 | Mendez et al. | JP | 10-34522 | 2/1998 |
| 2001/0040997 A1 | 11/2001 | Tsap et al. | JP | 10-173029 | 6/1998 |
| 2001/0042690 A1 | 11/2001 | Talieh | JP | 11-67853 | 3/1999 |
| 2001/0044667 A1 | 11/2001 | Nakano et al. | JP | 11-126816 | 5/1999 |
| 2002/0032499 A1 | 3/2002 | Wilson et al. | JP | 11-135601 | 5/1999 |
| 2002/0058460 A1 | 5/2002 | Lee et al. | JP | 2000-183001 | 6/2000 |
| 2002/0070126 A1 | 6/2002 | Sato et al. | JP | 2001-76982 | 3/2001 |
| 2002/0077031 A1 | 6/2002 | Johannson et al. | JP | 2001-284299 | 10/2001 |
| 2002/0081951 A1 | 6/2002 | Boyd et al. | JP | 2001-305108 | 10/2001 |
| 2002/0089676 A1 | 7/2002 | Pecen et al. | JP | 2002-9030 | 1/2002 |
| 2002/0102853 A1 | 8/2002 | Li et al. | JP | 2002-343754 | 11/2002 |
| 2002/0107599 A1 | 8/2002 | Patel et al. | TW | 434103 | 5/2001 |
| 2002/0107604 A1 | 8/2002 | Riley et al. | TW | 436383 B | 5/2001 |
| 2002/0113039 A1 | 8/2002 | Mok et al. | TW | 455938 B | 9/2001 |
| 2002/0127950 A1 | 9/2002 | Hirose et al. | TW | 455976 | 9/2001 |
| 2002/0128805 A1 | 9/2002 | Goldman et al. | WO | WO 95/34866 | 12/1995 |
| 2002/0149359 A1 | 10/2002 | Crouzen et al. | WO | WO 98/05066 | 2/1998 |
| 2002/0165636 A1 | 11/2002 | Hasan | WO | WO 98/45090 | 10/1998 |
| 2002/0173129 A1 * | 11/2002 | Shin et al. .................. 438/586 | WO | WO 99/09371 | 2/1999 |
| 2002/0183986 A1 | 12/2002 | Stewart et al. | WO | WO 99/25520 | 5/1999 |
| 2002/0185658 A1 | 12/2002 | Inoue et al. | WO | WO 99/59200 | 11/1999 |
| 2002/0193899 A1 | 12/2002 | Shanmugasundram et al. | WO | WO 00/00874 | 1/2000 |
| 2002/0193902 A1 | 12/2002 | Shanmugasundram et al. | WO | WO 00/05759 | 2/2000 |
| 2002/0197745 A1 | 12/2002 | Shanmugasundram et al. | WO | WO 00/35063 | 6/2000 |
| 2002/0197934 A1 | 12/2002 | Paik | WO | WO 00/54325 | 9/2000 |
| 2002/0199082 A1 | 12/2002 | Shanmugasundram et al. | WO | WO 00/79355 A1 | 12/2000 |
| 2003/0017256 A1 | 1/2003 | Shimane | WO | WO 01/11679 A1 | 2/2001 |
| 2003/0020909 A1 | 1/2003 | Adams et al. | WO | WO 01/15865 A1 | 3/2001 |
| 2003/0020928 A1 | 1/2003 | Ritzdorf et al. | WO | WO 01/18623 A1 | 3/2001 |
| 2003/0154062 A1 | 8/2003 | Daft et al. | WO | WO 01/25865 A1 | 4/2001 |
| | | | WO | WO 01/33277 A1 | 5/2001 |
| | FOREIGN PATENT DOCUMENTS | | WO | WO 01/33501 A1 | 5/2001 |
| | | | WO | WO 01/52055 A3 | 7/2001 |
| CA | 2165847 | 8/1991 | WO | WO 01/52319 A1 | 7/2001 |
| CA | 2194855 | 8/1991 | WO | WO 01/57823 A2 | 8/2001 |
| EP | 0 397 924 A1 | 11/1990 | WO | WO 01/80306 A2 | 10/2001 |
| EP | 0 621 522 A2 | 10/1994 | WO | WO 02/17150 A1 | 2/2002 |

| | | | |
|---|---|---|---|
| WO | WO 02/31613 A2 | 4/2002 |
| WO | WO 02/31613 A3 | 4/2002 |
| WO | WO 02/33737 A2 | 4/2002 |
| WO | WO 02/074491 A1 | 9/2002 |

OTHER PUBLICATIONS

Cunningham, James A. 2003. "Using Electrochemistry to Improve Copper Interconnects." <http://www.e-insite.net/semiconductor/index.asp?layout=article&articleid=CA47465>.
U.S. Appl. No. 09/363,966, filed Jul. 29, 1999, Arackaparambil et al., Computer Integrated Manufacturing Techniques.
U.S. Appl. No. 09/469,227, filed Dec. 22, 1999, Somekh et al., Multi-Tool Control System, Method and Medium.
U.S. Appl. No. 09/619,044, filed Jul. 19, 2000, Yuan, System and Method of Exporting or Importing Object Data in a Manufacturing Execution System.
U.S. Appl. No. 09/637,620, filed Aug. 11, 2000, Chi et al., Generic Interface Builder.
U.S. Appl. No. 09/656,031, filed Sep. 6, 2000, Chi et al., Dispatching Component for Associating Manufacturing Facility Service Requestors with Service Providers.
U.S. Appl. No. 09/655,542, filed Sep. 6, 2000, Yuan, System, Method and Medium for Defining Palettes to Transform an Application Program Interface for a Service.
U.S. Appl. No. 09/725,908, filed Nov. 30, 2000, Chi et al., Dynamic Subject Information Generation in Message Services of Distributed Object Systems.
U.S. Appl. No. 09/800,980, filed Mar. 8, 2001, Hawkins et al., Dynamic and Extensible Task Guide.
U.S. Appl. No. 09/811,667, filed Mar. 20, 2001, Yuan et al., Fault Tolerant and Automated Computer Software Workflow.
U.S. Appl. No. 09/927,444, filed Aug. 13, 2001, Ward et al., Dynamic Control of Wafer Processing Paths in Semiconductor Manufacturing Processes.
U.S. Appl. No. 09/928,473, filed Aug. 14, 2001, Koh, Tool Services Layer for Providing Tool Service Functions in Conjunction with Tool Functions.
U.S. Appl. No. 09/928,474, filed Aug. 14, 2001, Krishnamurthy et al., Experiment Management System, Method and Medium.
U.S. Appl. No. 09/943,383, filed Aug. 31, 2001, Shanmugasundram et al., In Situ Sensor Based Control of Semiconductor Processing Procedure.
U.S. Appl. No. 09/943,955, filed Aug. 31, 2001, Shanmugasundram et al., Feedback Control of a Chemical Mechanical Polishing Device Providing Manipulation of Removal Rate Profiles.
U.S. Appl. No. 09/998,372, filed Nov. 30, 2001, Paik, Control of Chemical Mechanical Polishing Pad Conditioner Directional Velocity to Improve Pad Life.
U.S. Appl. No. 09/998,384, filed Nov. 30, 2001, Paik, Feedforward and Feedback Control for Conditioning of Chemical Mechanical Polishing Pad.
U.S. Appl. No. 10/084,092, filed Feb. 28, 2002, Arackaparambil et al., Computer Integrated Manufacturing Techniques.
U.S. Appl. No. 10/100,184, filed Mar. 19, 2002, Al-Bayati et al., Method System and Medium for Controlling Semiconductor Wafer Processes Using Critical Dimension Measurements.
U.S. Appl. No. 10/135,405, filed May 1, 2002, Reiss et al., Integration of Fault Detection with Run-to-Run Control.
U.S. Appl. No. 10/135,451, filed May 1, 2002, Shanmugasundram et al., Dynamic Metrology Schemes and Sampling Schemes for Advanced Process Control in Semiconductor Processing.
U.S. Appl. No. 10/172,977, filed Jun. 18, 2002, Shanmugasundram et al., Method, Systen and Medium for Process Control for the Matching of Tools, Chambers and/or Other Semiconductor-Related Entities.
U.S. Appl. No. 10/173,108, filed Jun. 18, 2002, Shanmugasundram et al., Integrating Tool, Module, and Fab Level Control.
U.S. Appl. No. 10/174,370, filed Jun. 18, 2002, Shanmugasundram et al., Feedback Control of Plasma-Enhanced Chemical Vapor Deposition Processes.
U.S. Appl. No. 10/174,377, filed Jun. 18, 2002, Schwarm et al., Feedback Control of Sub-Atmospheric Chemical Vapor Deposition Processes.
U.S. Appl. No. 10/377,654, filed Mar. 4, 2003, Kokotov et al., Method, System and Medium for Controlling Manufacturing Process Using Adaptive Models Based on Empirical Data.
U.S. Appl. No. 10/393,531, filed Mar. 21, 2003, Shanmugasundram et al., Copper Wiring Module Control.
U.S. Appl. No. 10/632,107, filed Aug. 1, 2003, Schwarm et al., Method, System, and Medium for Handling Misrespresentative Metrology Data Within an Advanced Process Control System.
U.S. Appl. No. 10/665,165, filed Sep. 18, 2003, Paik, Feedback Control of a Chemical Mechanical Polishing Process for Multi-Layered Films.
U.S. Appl. No. 10/712,273, filed Nov. 14, 2003, Kokotov, Method, System and Medium for Controlling Manufacture Process Having Multivariate Input Parameters.
U.S. Appl. No. 10/759,108, filed Jun. 20, 2004, Schwarm, Automated Design and Execution of Experiments with Integrated Model Creation for Semiconductor Manufacturing Tools.
U.S. Appl. No. 10/765,921, filed Jan. 29, 2004, Schwarm, System, Method, and Medium for Monitoring Performance of an Advanced Process Control System.
U.S. Appl. No. 10/809,906, filed Mar. 26, 2004, Surana et al., A Technique for Process-Qualifying a Semiconductor Manufacturing Tool Using Metrology Data.
U.S. Appl. No. 10/809,908, filed Mar. 26, 2004, Yang et al., Improved Control of Metal Resistance in Semiconductor Products via Integrated Metrology.
Miller, G. L., D. A. H. Robinson, and J. D. Wiley. Jul. 1976, "Contactless measurement of semiconductor conductivity by radio frequency-free-carrier power absorption." *Rev. Sci. Instrum.*, vol. 47, No. 7, pp. 799-805.
Ostanin, Yu. Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.
Feb. 1984. "Method and Apparatus of in Situ Measurement and Overlay Error Analysis for Correcting Step and Repeat Lithographic Cameras." *IBM Technical Disclosure Bulletin*, pp. 4855-4859.
Feb. 1984. "Substrate Screening Process." *IBM Technical Disclosure Bulletin*, pp. 4824-4825.
Oct. 1984. "Method to Characterize the Stability of a Step and Repeat Lithographic System." *IBM Technical Disclosure Bulletin*, pp. 2857-2860.
Levine, Martin D. 1985. *Vision in Man and Machine*. New York: McGraw-Hill, Inc. pp. ix-xii, 1-58.
Herrmann, D. 1988. "Temperature Errors and Ways of Elimination for Contactless Measurement of Shaft Vibrations (Abstract)." *Technisches Messen*™, vol. 55, No. 1, pp. 27-30. West Germany.
Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.
Runyan, W. R., and K. E. Bean. 1990. "Semiconductor Integrated Circuit Processing Technology." p. 48. Reading, Massachusetts: Addison-Wesley Publishing Company.
Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.
Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.
Burke, Peter A. Jun. 1991. "Semi-Empirical Modelling of SiO2 Chemical-Mechanical Polishing Planarization." *VMIC Conference, 1991 IEEE*, pp. 379-384. IEEE
Zorich, Robert. 1991. *Handbook of Quality Integrated Circuit Manufacturing*. pp. 464-498 San Diego, California: Academic Press, Inc.
Rampalli, Prasad, Arakere Ramesh, and Nimish Shah. 1991. *CEPT—A Computer-Aided Manufacturing Application for Manag-*

*ing Equipment Reliability and Availability in the Semiconductor Industry.* New York, New York: IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, n. 4, pp. 308-318.

Feb. 1993. "Electroless Plating Scheme to Hermetically Seal Copper Features." *IBM Technical Disclosure Bulletin*, pp. 405-406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.

Matsuyama, Akira and Jessi Niou. 1993. "A State-of-the-Art Automation System of an ASIC Wafer Fab in Japan." *IEEE/SEMI International Semiconductor Manufacturing Science Symposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manfacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conferecne on Munich, Germany Sep. 12-16, 1994.* New York, New York: IEEE. pp. 105-112.

Schaper, C. D., M. M. Moslehi, K. C. Saraswat, and T. Kailath. Nov. 1994. "Modeling, Indentification, and Control of Rapid Thermal Processing Systems (Abstract)." *Journal of Electrochemical Society*, vol. 141, No. 11, pp. 3200-3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Moyne, James, Roland Telfeyan, Arnon Hurwitz, and John Taylor. Aug. 1995, "A Process-Independent Run-to-Run Controller and Its Application to Chemical-Mechanical Planarization." *SEMI/IEEE Advanced Semiconductor Manufacturing Conference and Workshop.* Ann Arbor, Michigan: The University of Michigan, Electrical Engineering & Computer Science Center for Display Technology & Manufacturing.

Zhou, Zhen-Hong and Rafael Reif. Aug. 1995. "Epi-Film Thickness Measurements Using Emission Fourier Transform Infrared Spectroscopy—Part II: Real-Time *in Situ* Process Monitoring and Control." IEEE Transactions on Semiconductor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: 42nd National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.

Moyne, James R., Nauman Chaudhry, and Roland Telfeyan. 1995. "Adaptive Extensions to a Multi-Branch Run-to-Run Controller for Plasma Etching." *Journal of Vacuum Science Technology*. Ann Arbor, Michigan: University of Michigan Display Technology Manufacturing Center.

Schmid, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, 4th Stambaugh, Y. Li and J. Ben-Jacob. Feb. 1996. "On-Line Integrated Metrology for CMP Processing." Santa Clara, California: VMIC Speciality Conferences, 1st International CMP Planarization Conference.

Leang, Sovarong, Shang-Yi Ma, John Thomson, Bart John Bombay, and Costas J. Spanos. May 1996. "A Control System for Photolithographic Sequences." *IEEE Transactions on Semicoductor Manufacturing*, vol. 9, No. 2.

Smith, Taber, Duane Boning, James Moyne, Arnon Hurwitz, and John Curry. Jun. 1996. "Compensating for CMP Pad Wear Using Run by Run Feedback Control." Santa Clara, California: Proceedings of the Thirteenth International VLSI Multilevel Interconnection Conference. pp. 437-439.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Trend Detection of Sequence-Disordered Data Using EWMA Method." *IEEE/SEMI Advanced Semiconductor Manufacturing Conference*, pp. 169-174.

SEMI. [1986] 1996. "Standard for Definintion and Measurement of Equipment Reliability, Availability, and Maintainability (RAM)." SEMI E10-96.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6th International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Ram Akella, and Andrzej J. Strojwas. 1997. "Excursion Detection and Source Isolation in Defect Inspection and Classification." 2nd *International Workshop on Statistical Metrology*, pp. 90-93.

Van Zant, Peter. 1997. *Microchip Fabrication: A Practical Guide to Semiconductor Processing*. Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." *Automatica*, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference.

Jul. 1998. "Active Controller: Utilizing Active Databases for Implementing Multistep Control of Semiconductor Manufactuirng (Abstract)." *IEEE Transactions on Components, Packaging and Manufacturing Technology—Part C*, vol. 21, No. 3, pp. 217-224.

SEMI. Jul. 1998. *New Standard: Provisional Specification for CIM Framework Domain Architecutre*. Mountain View, California: SEMI Standards. SEMI Draft Doc. 2817.

Consilium. Aug. 1998. *Quality Management Component: QMC™ and QMC-Link™ Overview*. Mountain View, California: Consilium, Inc.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washigton: SEMETECH Symposium.

Consilium. 1998. *FAB300™*. Mountain View, California: Consilium, Inc.

Fang, S. J., A. Barada, T. Janecko, W. Little, D. Outley, G. Hemple, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.

Khan, Kareemullah, Victor Solakhain, Anthony Ricci, Tier Gu, and James Moyne. 1998. "Run-to-Run Control of ITO Deposition Process." Ann Arbor, Michigan.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium, pp. 1-10.

Consilium. Jan. 1999. "FAB300™: Consilium's Next Generation MES Solution of Software and Services which Control and Automate Real-Time FAB Operations." www.consilium.com/products/fab300_page.htm#FAB300 Introduction.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*

McIntosh, John. Mar. 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Klein, Bruce. Jun. 1999. "Application Development: XML Makes Object Models More Useful." Informationweek. pp. 1A-6A.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Consilium Corporate Brochure. Oct. 1999. www.consilium.com.

Khan, K., C. El Chemali, J. Moyne, J. Chapple-Sokol, R. Nadeau, P. Smith, C., and T. Parikh. Oct. 1999. "Yield Improvement at the Contact Process Through Process Through Run-to-Run Control (Abstract)." *24th IEEE/CPMT Electronics Manufacturing Technology Symposium*, pp. 258-263.

Moyne, James. Oct. 1999. "Advancements in CMP Process Automation and Control." Hawaii: (Invited paper and presentation to) Third International Symposium on Chemical Mechanical Polishing in IC Device Manufacturing: 196th Meeting of the Electrochemical Society.

Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings, 1999 IEEE International Symposium on Santa Clara, CA*. Piscataway, NJ. pp. 43-46.

Consilium. Nov. 1999. *FAB300™ Update*.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

1999. "Contactless Bulk Resistivity/Sheet Resistance Measurement and Mapping Systems." www.Lehighton.com/fabtech1/index.html.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T.F., W. J. Campbell, and C. Bode. Dec. 1999. "Model-Based Control in Microelectronics Manufacturing ." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232-237.

Chemali, Chadi El. James Moyne, Kareemullah Khan, Rock Nadeau, Paul Smith, John Colt, Jonathan Chapple-Sokol, and Tarun Parikh. Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 µm & Beyond." <http://acmrc.com/press/ACM-ECP-brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

SEMI. 2000. "Provisional Specification for CIM Framework Scheduling Component." San Jose, California SEMI E105-1000.

2000. "Microsense II Capacitance Gaging System." www.adetech.com.

Chen, Argon and Ruey-Shan Guo. Feb. 2001. "Age-Based Double EWMA Controller and Its Application to CMP Processes." *IEEE Transactions on Semiconductor Manufacturing*, vol. 14, No. 1, pp. 11-19.

Mar. 5, 2001. "KLA-Tenor Introduces First Production-worthy Copper CMP In-situ Film Thickness and End-point Control System." http://www.kla-tencor.com/j/servlet/NewsItem?newsItemID=74.

Lee, Brian, Duane S. Boning, Winthrop Baylies, Noel Poduje, Pat Hester, Yong Xia, John Valley, Chris Koliopoulus, Dale Hetherington, HonJiang Sun, and Michael Lacy. Apr. 2001. "Wafer Nanotopography Effects on CMP: Experimental Validation of Modeling Methods." San Francisco, California: Materials Research Society Spring Meeting.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." $51^{st}$ *Electronic Components and Technology Conference 2001. Proceedings*, pp. 1372-1379. Orlando, Florida.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Pilu, Maurizio. Sep. 2001. "Undoing Page Curl Distortion Using Applicable Surfaces." *IEEE International Conference on Image Processing*. Thessalonica, Greece.

Oct. 15, 2001. Search Report prepared by the Austrian Patent Office for Singapore Patent Application No. 200004286-1.

Wang, LiRen and Hefin Rowlands. 2001. "A Novel NN-Fuzzy-SPC Feedback Control System." $8^{th}$ *IEEE International Conference on Emerging Technologies and Factory Automation*, pp. 417-423.

NovaScan 2020. Feb. 2002. "Superior Integrated Process Control for Emerging CMP High-End Applications."

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Moyne, J., V. Solakhian, A. Yershov, M. Anderson, and D. Mockler-Hebert. Apr.-May 2002. "Development and Deployment of a Multi-Component Advanced Process Control System for a Epitaxy Tool (Abstract)." *2002 IEEE Advanced Semiconductor Manufacturing Conference and Workshop*, pp. 125-130.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr.-May 2002. "Advance Process Control Solutions for Semiconductor Manufacturing." Boston, Massachusetts: $13^{th}$ *Annnual IEEE/SEMI Advanced Semiconductor Manufacturing Conference. Advancing the Science and Technology of Semiconductor Manufacturing. ASMC 2002*, pp. 101-106.

Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Johnson, Bob. Jun. 10, 2002. "Advanced Process Control Key to Moore's Law." Gartner, Inc.

Jun. 20, 2002. Office Action for U.S. Appl. No. 09/619,044, filed Jul. 19, 2000.

Jul. 9, 2002. International Search Report for PCT/US01/24910.

Jul. 23, 2002. Communication Pursuant to Article 96(2) EPC for European Patent Application No. 00 115 577.9.

Jul. 29, 2002. International Search Report for PCT/US01/27407.

Sep. 26, 2002. Office Action for U.S. Appl. No. 09/637,620, filed Aug. 11, 2000.

Oct. 4, 2002. International Search Report for PCT/US01/22833.

Oct. 15, 2002. International Search Report for PCT/US02/19062.

Oct. 23, 2002. Internaitonal Search Report for PCT/US01/27406.

Oct. 23, 2002. Office Action for U.S. Appl. No. 09/469,227, filed Dec. 22, 1999.

Nov. 7, 2002. International Search Report for PCT/US02/19061.

Nov. 11, 2002. International Search Report for PCT/US02/19117.

Nov. 12, 2002. International Search Report for PCT/US02/19063.

Dec. 17, 2002. Office Action for U.S. Appl. No. 09/363,966, filed Jul. 29, 1999.

ACM Research, Inc. 2002. "ACM Ultra ECP® System: Electro-Copper Plating (EPC) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA-Tencor Corporation . 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.

Sonderman, Thomas. 2002. "APC as a Competitive Manufacturing Technology: *AMD's Vision for 300mm.*" AEC/APC.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

2002. "Microsense II—5810: non-Contact Capacitance Gaging Module." www.adetech.com.

Feb. 10, 2003. Office Action for U.S. Appl. No. 09/619,044, filed Jul. 19, 2000.

Mar. 25, 2003. International Search Reprot for PCT/US02/24859.

Apr. 9, 2003. Office Action for U.S. Appl. No. 09/928,474, filed Aug. 14, 2001.

May 8, 2003. Office Action for U.S. Appl. No. 09/637,620, filed Aug. 11, 2000.

May 23, 2003. Written Opinion for PCT/US01/24910.

Jun. 18, 2003. Office Action for U.S. Appl. No. 09/655,542, filed Sep. 6, 2000.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 8, 2003. PCT International Search Report from PCT/US03/08513.

Aug. 20, 2003. Written Opinion for PCT/US01/22833.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

Nov. 5, 2003. Office Action for U.S. Appl. No. 10/172,977, filed Jun. 18, 2002.

Dec. 1, 2003. Office Action for U.S. Appl. No. 10/173,108, filed Jun. 18, 2002.

"NanoMapper wafer nanotopography measurement by ADE Phase Shift." Printed Dec. 9, 2003. http://www.phase-shift.com/nanomap.shtml.

"Wafer flatness measurement of advanced wafers." Printed Dec. 9, 2003. http://www.phase-shift.com/wafer-flatness.shtml.

"ADE Technologies, Inc.—6360." Printed Dec. 9, 2003. http://www.adetech.com/6360,shtml.

"3D optical profilometer MicroXAM by ADE Phase Shift." Printed Dec. 9, 2003. http://www.phase-shift.com/microxam.shtml.

"NanoMapper FA factory automation wafer nanotopography measurement." Printed Dec. 9, 2003. http://www.phase-shift.com/nanomapperfa.shtml.

Dec. 11, 2003. Office Action for U.S. Appl. No. 09/943,383, filed Aug. 31, 2001.

Dec. 16, 2003. International Search Report for PCT/US03/23964.

Jan. 20, 2004. Office Action for U.S. Appl. No. 09/927,444, filed Aug. 31, 2001.

Jan. 23, 2004. International Search Report for PCT/US02/24860.

Feb. 2, 2004. Office Action for U.S. Appl. No. 09/363,966, filed Jul. 29, 1999.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*—12$^{th}$ Edition. Applied Materials, Inc., Santa Clara, CA.

Berman, Mike, Thomas Bibby, and Alan Smith. "Review of In Situ & In-line Detection for CMP Applications." *Semiconductor Fabtech*, 8$^{th}$ Edition, pp. 267-274.

Dishon, G., D. Eylon, M. Finarov, and A. Shulman. "Dielectric CMP Advanced Process Control Based on Integrated Monitioring." Ltd. Rehoveth, Israel: Nova Measuring Instruments.

"Semiconductor Manufacturing: an Overview." <http://users.ece.gatech.edu/~gmay/overview.html>.

Sun, S.C. 1998. "CVD and PVD Transition Metal Nitrides as Diffusion Barriers for Cu Metallization." *IEEE*. pp. 243-246.

Tagami, M., A. Furuya, T. Onodera, and Y. Hayashi. 1999. "Layered Ta-nitrides (LTN) Barier Film by Power Swing Sputtering (PSS) Technique for MOCVD-Cu Damascene Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications", (Abstract). *IEEE*. pp. 207-209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115-118.

Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*, vol. 14, No. 13-14, pp. 149-153.

Peng, C.H., C.H., Hseih, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.

Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.

Jul. 25, 2003. International Search Report for PCT/US02/24858.

Mar. 30, 2004. Written Opinion for PCT/US02/19062.

Apr. 9, 2004. Written Opinion for PCT/US02/19116.

Arp. 22, 2004. Office Action for U.S. Appl. No. 09/998,372, filed Nov. 30, 2001.

Apr. 28, 2004. Written Opinion for PCT/US02/19117.

Apr. 29, 2004. Written Opinion for PCT/US02/19061.

May 5, 2004. Office Action for U.S. Appl. No. 09/943,955, filed Aug. 31, 2001.

May 5, 2004. International Preliminary Examination Report for PCT/US01/27406.

May 28, 2004. Office Action for U.S. Appl. No. 09/943,383, filed Aug. 31, 2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Appl. No. 09/800,980, filed Mar. 8, 2001.

Jul. 12, 2004. Office Action for U.S. Appl. No. 10/173,108, filed Jun. 8, 2002.

IslamRaja, M. M., C. Chang, J. P. McVittie, M. A. Cappelli, and K. C. Saraswat. May/Jun. 1993. "Two Precursor Model for Low-Pressure Chemical Vapor Deposition of Silicon Dioxide from Tetraethylorthosilicate." *J. Vac. Sci. Technol. B*, vol. 11, No. 3, pp. 720-726.

Kim, Eui Jung and William N. Gill. Jul. 1994. "Analytical Model for Chemical Vapor Deposition of $SiO_2$ Films Using Tetraethoxysliane and Ozone" (Abstract). *Journal of Crystal Growth*, vol. 140, Issue 3-4, pp. 315-326.

Guo, R.S., A. Chen, C.L. Tseng, I.K. Fong, A. Yang, C.L. Lee, C.H. Wu, S. Lin, S.J. Huang, Y.C. Lee, S.G. Chang, and M.Y. Lee, Jun. 16-17, 1998. "A Real-Time Equipment Monitoring and Fault Detection System." *Semiconductor Manufacturing Technology Workshop*, pp. 111-121.

Lantz, Mikkel. 1999. "Equipment and APC Integration at AMD with Workstream." *IEEE*, pp. 325-327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 9, 2004. Written Opinion for PCT Serial No. PCT/US02/19063.

Aug. 18, 2004. International Preliminary Examination Report for PCT Serial No. PCT/US02/19116.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Serial No. PCT/US02/21942.

Sep. 16, 2004. International Preliminary Examination Report for PCT Serial No. PCT/US02/24859.

Sep. 15, 2004. Office Action for U.S. Appl. No. 10/632,107, filed Aug. 1, 2003.

Sep. 29, 2004. Office Action for U.S. Appl. No. 09/363,966, filed Jul. 29, 1999.

Oct. 1, 2004. International Preliminary Examination Report for PCT Serial No. PCT/US03/23964.

Oct. 6, 2004. Office Action for U.S. Appl. No. 10/759,108, filed Jan. 20, 2004.

Oct. 12, 2004. International Preliminary Examination Report for PCT Serial No. PCT/US02/19061.

Nov. 17, 2004. Written Opinion for PCT Serial No. PCT/US01/27407.

Boning, Duane et al. "Run by Run Control of Chemical-Mechanical Polishing." *IEEE Trans,* Oct. 1996. vol. 19, No. 4, pp. 307-314.

Moyne, James et al. "A Run-to-Run Control Framework for VLSI Manufacturing." *Microelectronic Processing '93 Conference Proceedings.* Sep. 1993.

Telfeyan, Roland et al. "Demonstration of a Process-Independnet Run-to-Run Controller." *187th Meeting of the Electrochemical Society.* May 1995.

Moyne, James et al. "A Process-Independent Run-to-Run Controller and Its Application to Chemical-Mechanical Planarization." *SEMI/IEEE* Adv. Semiconductor Manufacturing Conference. Aug. 15, 1995.

Moyne, James et al. Adaptive Extensions to be a Multi-Branch Run-to-Run Controller for Plasma Etching." *Journal of Vacuum Science and Technology.* 1995.

US 6,150,664, 11/2000, Su (withdrawn)

* cited by examiner

SELECTIVE METAL ENCAPSULATION SCHEMES

RELATED APPLICATIONS

This application claims priority under 35 U.S.C. § 119(e) to U.S. provisional application Ser. No. 60/475,351, filed Jun. 3, 2003, which is incorporated herein by reference.

FIELD OF THE INVENTION

The present invention relates generally to semiconductor manufacturing, and more particularly to systems and methods for the deposition of barrier film layers on a conductive feature of the device.

BACKGROUND OF THE INVENTION

A common goal in the integrated circuit (IC) industry is to place more conductive circuitry into a smaller substrate surface area. Recent improvements in circuitry of ultra-large scale integration (ULSI) on semiconductor substrates indicate that future generations of semiconductor devices will require sub-quarter micron (or less) multilevel metallization. The multilevel interconnects that lie at the heart of this technology require planarization of interconnect features formed in high aspect ratio apertures, including contacts, vias, lines and other features. One example of the use of such multilevel metallization is in "dual damascene" processing, in which two channels of conductive materials are positioned in vertically separated planes perpendicular to each other and interconnected by a vertical "via" at their closest point.

Currently, copper and its alloys have become the metals of choice for ULSI technology because copper has a lower resistivity than aluminum, (1.7 μΩ-cm compared to 3.1 μΩ-cm for aluminum), a higher current carrying capacity, and significantly higher electromigration resistance. These characteristics are important for supporting the higher current densities experienced at high levels of integration and increased device speed. Further, copper has a good thermal conductivity and is available in a highly pure state.

However, copper readily forms copper oxide when exposed to atmospheric conditions or environments outside of processing equipment. Metal oxides can result in an increase the resistance of metal layers, become a source of particle problems, and reduce the reliability of the overall circuit.

One known solution is to deposit a passivating layer or an encapsulation layer such as a dielectric material on the metal layer to prevent metal oxide formation. However, the high dielectric constant of the dielectric material increases the interlayer capacitance in multilayer environments. Furthermore, the electromigration of copper in dielectric materials is unacceptably high.

Cobalt and cobalt alloys, which are conductive (low dielectric constant) and are good barriers to electromigration of copper, have been used for passivating copper. Cobalt may be deposited by electroless deposition techniques on copper. However, copper does not satisfactorily catalyze or initiate deposition of materials from electroless solutions. It is possible to activate the copper surface to cobalt deposition by first depositing a catalytic material, such as palladium, on the copper surface. Cobalt is then selectively deposited by electroless plating onto the catalytic material. However, deposition of the catalytic material may require multiple steps or the use catalytic colloidal compounds. Catalytic colloidal compounds, and colloidal palladium materials in particular, adhere to dielectric materials and result in the undesired, excessive, and non-selective deposition of the catalyst material on the substrate surface. Alternatively, palladium can be deposited selectively on copper surfaces by a displacement mechanism in which palladium replaces a thin layer of the exposed copper on the wafer surface. However, common semiconductor fabrication methods invariably leave copper atom contaminants on the wafer surface, so that palladium is deposited on undesired locations, e.g., dielectric surfaces, as well as desired locations, e.g., conductive metal feature. In the subsequent step of cobalt deposition, cobalt is electrolessly deposited wherever palladium is present, leading to the non-selective deposition of cobalt.

Non-selective deposition of passivation material may lead to surface contamination, unwanted diffusion of conductive materials into dielectric materials, and even device failure from short circuits and other device irregularities.

There is a need for methods and systems for deposition of passivation materials that eliminate or minimize their non-selective deposition.

SUMMARY OF THE INVENTION

In one aspect of the methods and systems of the present invention, a sacrificial protective layer is used to prevent stray electroless deposition of a conductive passivating layer on a substrate surface. In one or more embodiments, the protective layer is deposited onto a substrate surface having at least one conductive element, and the protective layer is processed to expose the conductive element of the substrate surface. A conductive passivating layer is then deposited, e.g., electrolessly, on the exposed conductive element(s) of the substrate. The sacrificial protective layer prevents nucleation of the passivating layer on the substrate surface during deposition of the passivating layer. Any undesired deposition of passivation material on areas other than the conductive element(s), e.g., on the protective layer, is eliminated with the removal of the protective layer.

In one or more embodiments, the protective layer is an organic material, such as photoresist, amorphous carbon, a dielectric material, or an etch stop material. In one or more embodiments, the method includes providing one or more intermediate layers disposed between the substrate surface and the protective layer.

One or more embodiments of the present invention contemplate the deposition of an intermediate layer onto the substrate surface prior to deposition of the protective layer.

In another aspect of the invention, a method of processing a semiconductor substrate to encapsulate a conductive element is provided. The method includes the steps of depositing a metallic passivating layer onto a substrate surface comprising a conductive element, masking the passivating layer to protect the underlying conductive element of the substrate surface, etching the unmasked passivating layer to expose the underlying intermediate layers or substrate surface, and removing the mask from the passivating layer after etching.

The methods and systems of the present invention provide a semiconductor device having a conductive element selectively encapsulated by a metallic passivating layer. The passivating layer interface with the conductive element is of low capacitance. The passivating layer also provides an effective barrier to electromigration of copper into adjacent dielectric regions. Significantly, the surface of the substrate is substantially free of stray electrolessly deposited passivation material, which reduces the incidence of surface contamination, device failure from short circuit, and other device irregularities.

BRIEF DESCRIPTION OF THE DRAWING

Various objects, features, and advantages of the present invention can be more fully appreciated with reference to the following detailed description of the invention when considered in connection with the following drawings, in which like reference numerals identify like elements. The following drawings are for the purpose of illustration only and are not intended to be limiting of the invention, the scope of which is set forth in the claims that follow.

DETAILED DESCRIPTION OF THE INVENTION

The words and phrases used herein should be given their ordinary and customary meaning in the art by one skilled in the art unless otherwise further defined.

"Substrate surface" as used herein refers to a layer of material that serves as a basis for subsequent processing operations. For example, a substrate surface may contain one or more "conductive elements," such as aluminum, copper, tungsten, or combinations thereof, and may form part of an interconnect feature such as a plug, via, contact, line, wire, and may also form part of a metal gate electrode. A substrate surface may also contain one or more nonconductive materials, such as silicon, doped silicon, germanium, gallium arsenide, glass, and sapphire. The substrate surface may also contain one or more low k materials such as carbon-doped oxides, porous low k materials such as organic low k and inorganic low k materials and hybrids thereof, or air-gap structures.

The term "about" is used herein to mean approximately, in the region of, roughly or around. When the term "about" is used in conjunction with a numerical range, it modifies that range by extending the boundaries above and below the numerical values set forth. In general, the term "about" is used herein to modify a numerical value above and below the stated value with a variance of 10%.

Figure 1:
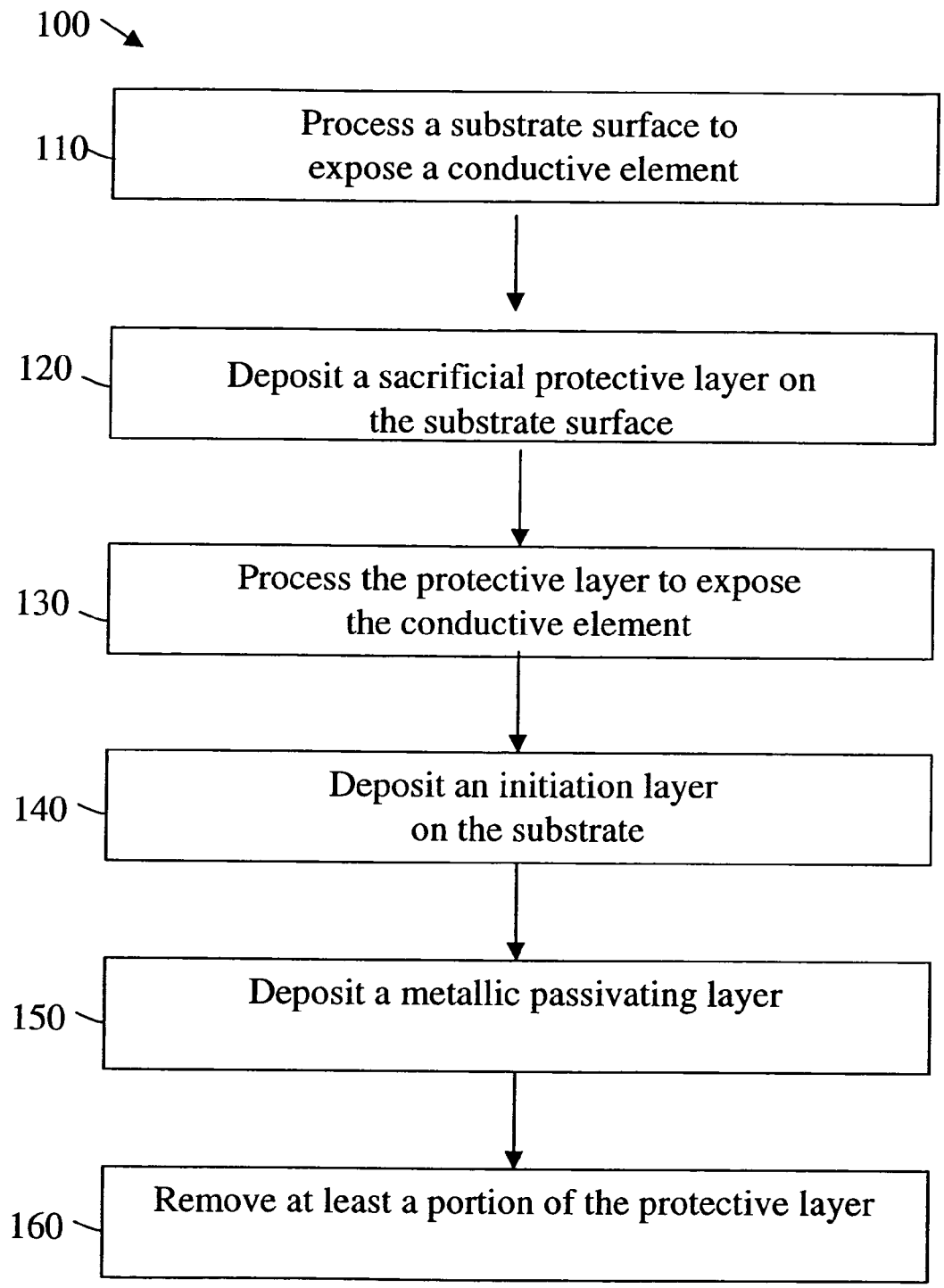
FIG. 1 is a flow chart illustrating steps undertaken in selective metal encapsulation schemes according to one or more embodiments of the present invention.

FIG. 1 is a flow chart illustrating an exemplary processing sequence 100 undertaken in depositing a conductive passivating layer according to one or more embodiments of the present invention.

In step 110 in FIG. 1, a substrate surface is prepared for deposition of the passivating layer. The surface can be treated to remove surface contaminants using materials removal and/or cleaning techniques known in the art. Exemplary materials removal techniques include chemical mechanical polishing (CMP) and etching. Wet etching techniques using HF solution and dry etch techniques using HF vapor are suitable for removing dielectric materials, such as silicon oxide, from the substrate surface. Other etching techniques include downstream or remote plasma etching using a hydrogen and water plasma, or a hydrogen plasma and in situ etch processes using hydrogen, hydrogen and nitrogen, or ammonia to remove metal oxides from the substrate surface. CMP is suitable for removal of various materials, including metals and dielectric materials. Other exemplary surface treatments include ultrasonication and cleaning with an acidic solution to remove metal oxides and other contaminants from the substrate surface. The exposed conductive feature(s) can also be rinsed with distilled water to remove residual contaminants from the surface treatment process.

In step 120 of FIG. 1, a sacrificial protective layer is deposited on the substrate surface. The protective layer can be any material that is compatible with the semiconductor fabrication process and that is unaffected by the subsequent deposition of a passivating layer. Exemplary materials for the protective layer include dielectrics, such as SiN, SiC, SiOC/SiC, and SiCN, photoresist, and organics such as amorphous carbon. The protective layer is deposited using known techniques such as chemical vapor deposition (CVD), plasma-enhanced chemical vapor deposition (PECVD), spin-on deposition and physical deposition processes, e.g., sputtering. The thickness of the protective layer can vary depending upon the materials used and the methods of material deposition and removal. Exemplary layer thicknesses are in the range of about 100 Å to about 5000 Å. With advances in deposition technology, such as atomic layer deposition, further reductions in film thickness are anticipated.

In step 130 of FIG. 1, the protective layer is processed to remove materials above the underlying conductive element (s) so as to expose the conductive element in the underlying substrate surface. Conventional masking and materials removal techniques known in the art can be used. Etching is a common technique used for the selective removal of material. Before etching begins, a wafer is coated with photoresist and exposed to a circuit pattern (or other pattern corresponding to the conductive element) during photolithography. Etching removes material only from areas dictated by the photoresist pattern. The photoresist can be a positive photoresist, in which case the exposed areas of a positive resist film are removed by the process of development. Alternatively, the photoresist can be a negative photoresist, in which case the mask pattern is a negative of the underlying conductive layer structure and the unexposed areas of the resist film are removed by the process of development.

The exposed protective layer is then etched to selectively remove the protective layer and expose the underlying conductive element. The etching technique is selective to the material of the protective layer and can be a dry etch such as HF vapor or reactive ion etch (RIE) with $CHF_3/O_2$ or plasma etch as described above. Plasma etching is performed by applying an electrical field to a gas containing a chemically reactive element, thereby generating reactive ions that can remove (etch) materials very rapidly. It also gives the chemicals an electric charge, which directs them toward the wafer vertically. This allows vertical etching profiles, which is desired in selective exposure of the features of the underlying substrate surface.

In the next step 140, it is contemplated by one or more embodiments of the present invention that an initiation layer can be deposited on the substrate surface to initiate the electroless deposition process. The initiation layer can be a noble metal and is typically very thin, e.g., only a few monolayers thick. The initiation layer generally forms selectively on the exposed conductive element by displacement of the noble metal for the conductive metal, or can be deposited as colloidal palladium. Although the displacement process is selective for the conductive metal, there typically is some stray deposition occurring on the nonconductive surfaces, e.g., the protective layer. The substrate is then rinsed to remove the displacement solution.

A conductive passivating layer then is selectively electrolessly deposited on the initiation layer in step 150 of FIG. 1. The conductive material used as the passivating layer is generally a metal that does not form a solid solution with copper or other conductive metals, such as ruthenium, tantalum, tungsten, cobalt, palladium, nickel, tin, titanium, molybdenum, platinum, iron, and niobium and their alloys. In one or more embodiments, the passivating conductive metal is cobalt or a cobalt alloy. In one or more other embodiments, the passivating layer is deposited directly onto the conductive element (step 150), without the need to first deposit an initiation layer (step 140). Electroless deposition processes for certain cobalt alloys, using boron-containing reducing agents, permit electroless deposition of metal without the need for an initiation layer.

At least a portion of the protective layer is removed in step 160 of FIG. 1 to remove any undesired passivation material at nucleation sites outside of the conductive element area. In one or more embodiments, a portion of the thickness of the protective layer is removed to ensure the removal of stray electroless deposition on the protective coating. In other exemplary embodiments, the entire protective layer is removed to expose the underlying layer, which may be the substrate surface or an intermediate layer.

The protective layer is removed or lifted using materials removal techniques known in the art. Exemplary, non-limiting materials removal techniques include chemical mechanical polishing (CMP), etching and ashing, e.g., plasma ashing. Reactive ion etching using $CHF_3/O_2$, wet etch techniques using HF solution, or dry etch techniques using HF vapor, are suitable for removing dielectric materials. Other etching techniques include downstream or remote plasma etching using a hydrogen and water plasma or a hydrogen plasma and in situ etch processes using hydrogen, hydrogen and nitrogen or ammonia. Wet etching and ashing can be used for the removal of carbon-containing layers, such as amorphous carbon and photoresist. The appropriate technique depends upon the composition of the material being removed. The exposed conductive feature also can be rinsed with distilled water to remove residuals from the materials removal process.

The process provides a conductive element having a conductive passivating layer selectively deposited thereon. Elsewhere, the substrate surface is free of unwanted conductive material. In exemplary embodiments, other than the deposited passivating layer, the substrate is returned to its original state prior to deposition of the passivating layer and is ready for further processing.

The electroless deposition process is described in greater detail below. Additional information regarding electroless deposition technology, generally, is found in co-pending U.S. application Ser. No. 10/117,712, entitled "Electroless Deposition Methods" and co-pending U.S. application Ser. No. 10/284,855, entitled "Post Rinse To Improve Selective Deposition Of Electroless Cobalt On Copper For ULSI Application," both of which are commonly owned and are incorporated by reference herein.

Electroless deposition is generally defined herein as deposition of a conductive material generally provided as charged ions in a bath over an active surface to deposit the conductive material by chemical reduction in the absence of an external electric current. Electroless deposition typically involves exposing a substrate to a solution by immersing the substrate in a bath or by spraying the solution over the substrate.

In one or more embodiments, an initiation layer may be formed on the exposed conductive elements by deposition of a noble metal in step 140. Embodiments of the present invention also contemplate the use of noble metals, such as gold, silver, iridium, rhenium, rhodium, rhenium, ruthenium, palladium, platinum, osmium, and combinations thereof. In one or more embodiments, the noble metal is selected from the group of palladium, platinum, or combinations thereof. The noble metal is deposited from an activation solution containing at least a noble metal salt and an inorganic acid. Examples of noble metal salts include palladium chloride ($PdCl_2$), palladium sulfate ($PdSO_4$), palladium ammonium chloride, and combinations thereof. Examples of inorganic acids include hydrochloric acid (HCl), sulfuric acid ($H_2SO_4$), hydrofluoric acid (HF) and combinations thereof. Alternatively, inorganic acids, such as carboxylic acids including acetic acid ($CH_3COOH$), may be used in the activation solution for the initiation layer.

In one or more embodiments of the present invention, displacement of the exposed conductive element, e.g., copper, by a noble metal, e.g., palladium, is carried out as follows. In a displacement plating process, wafers with an exposed copper surface are immersed in a bath containing dissolved ions of a metal more noble than copper. With simple immersion, the copper dissolves, i.e., is oxidized, and a film of the more noble metal deposits, i.e., is reduced, to thereby displace atoms of copper with the noble metal. Displacement is selective to copper and the coating thickness is self-limiting. Depending on the porosity of the copper, the noble metal may be up to a few monolayers thick.

The noble metal salt may be in the deposition solution at a concentration between about 20 parts per million (ppm) and about 20 g/liter. The concentration of the metal salt may also be described as a volume percent with 1 vol % corresponding to about 40 ppm. The inorganic acid is used to provide an acidic deposition composition, for example, at a pH of about 7 or less. A pH level between about 1 and about 3 has been observed to be effective in displacement deposition of the noble metals from the activation solution. An acidic solution has also been observed to be effective in removing or reducing oxides, such as metal oxides including copper oxides, from the metal or dielectric surface of the substrate during the activation deposition process.

The activation solution for the initiation layer is generally applied to the substrate surface for between about 1 second and about 300 seconds at a composition temperature between about 15° C. and about 80° C. The activation solution is generally provided at a flow rate between about 50 ml/min and about 2000 ml/min. In one aspect a total application of about 120 ml and about 200 ml of activation solution was provided to deposit the activation layer. The activation solution generally provides for the deposition of a noble metal to a thickness of about 50 Å or less, such as about 10 Å or less. The initiation layer may be continuous or discontinuous.

An example of an activation solution composition for depositing the initiation material includes about 3 vol % (120 ppm) of palladium chloride and sufficient hydrochloric acid to provide a pH of about 1.5 for the composition, which is applied to the substrate surface for about 30 seconds at a flow rate of about 750 ml/min at a composition temperature of about 25° C.

In other embodiments, the initiation layer is formed by exposing the exposed conductive materials to a borane-containing composition in step 140. The borane-containing composition forms a metal boride layer selectively on the exposed conductive metals, which provides catalytic sites for subsequent electroless deposition processes.

The borane-containing composition includes a borane reducing agent. Suitable borane-containing reducing agents include alkali metal borohydrides, alkyl amine boranes, and combinations thereof. Examples of suitable borane-containing reducing agents include sodium borohydride, dimethylamine borane (DMAB), trimethylamine borane, and combinations thereof. The borane-containing reducing agent comprises between about 0.25 grams per liter (g/L) and about 6 g/L of the boron-containing composition. The borane-containing composition may additionally include pH-adjusting agents to provide a pH of between about 8 and about 13. Suitable pH adjusting agents include potassium hydroxide (KOH), sodium hydroxide (NaOH), ammonium hydroxide, ammonium hydroxide derivatives, such as tetramethyl ammonium hydroxide, and combinations thereof.

The conductive element is generally exposed to the borane-containing composition between about 30 seconds and about 180 seconds at a composition temperature between about 15° C. and about 80° C. The borane-containing composition may be delivered to the substrate at a flow rate between about 50 ml/min and about 2000 ml/min. In one aspect a total application of about 120 ml and about 200 ml of the borane-containing composition was provided to form the initiation layer of a metal boride compound.

An example of a borane-containing composition for forming the layer includes about 4 g/L of dimethylamine borane (DMAB) and sufficient sodium hydroxide to provide a pH of about 9 for the composition, which is generally applied to the substrate surface for about 30 seconds at a flow rate of about 750 ml/min at a composition temperature of about 25° C.

A rinsing agent, typically deionized water, is then applied to the substrate surface to remove any solution used in forming the initiation layer.

A metallic passivating layer is deposited by an electroless process on the initiation layer in step 150. In one or more embodiments of the present invention, the metal passivating layer comprises cobalt or a cobalt alloy. Cobalt alloys include cobalt-tungsten alloy, cobalt-phosphorus alloy, cobalt-tin alloys, cobalt-boron alloys, including ternary alloys, such as cobalt-tungsten-phosphorus and cobalt-tungsten-boron. One or more embodiments of the present invention also contemplate the use of other materials, including nickel, tin, titanium, tantalum, tungsten, molybdenum, platinum, iron, niobium, palladium, platinum, and combinations thereof, and other alloys including nickel cobalt alloys, doped cobalt and doped nickel alloys, or nickel iron alloys, to form the metal layer as described herein.

In one or more embodiments of the present invention, the metallic passivation material is deposited from an electroless solution containing at least a metal salt and a reducing agent. The electroless solution may further include additives to improve deposition of the metal. Additives may include surfactants, complexing agents, pH adjusting agents, or combinations thereof.

Suitable metal salts include chlorides, sulfates, sulfamates, or combinations thereof. An example of a metal salt is cobalt chloride. The metal salt may be in the electroless solution at a concentration between about 0.5 g/L and about 30 g/L.

Cobalt alloys, such as cobalt-tungsten may be deposited by adding tungstic acid or tungstate salts including sodium tungstate, and ammonium tungstate, and combinations thereof for tungsten deposition. Phosphorus for the cobalt-tungsten-phosphorus deposition may be formed by phosphorus-containing reducing agents, such as hypophosphite. Cobalt alloys, such as cobalt-tin may be deposited by adding stannate salts including stannic sulfate, stannic chloride, and combinations thereof. The additional metals salts, for example, for tungsten and tin, may be in the electroless solution at a concentration between about 0.5 g/L and about 30 g/L.

Suitable reducing agents include sodium hypophosphite, hydrazine, formaldehyde, and combinations thereof. The reducing agents have a concentration between about 1 g/L and about 30 g/L of the electroless solution. For example, hypophosphite may be added to the electroless solution at a concentration between about 15 g/L and about 30 g/L.

The reducing agents may also include borane-containing reducing agents, such as sodium borohydride, dimethylamine borane (DMAB), trimethylamine borane, and combinations thereof. The borane-containing reducing agent comprises between about 0.25 grams per liter (g/L) and about 6 g/L of the boron-containing composition. The presence of borane-containing reducing agents allow for the formation of cobalt-boron alloys such as cobalt-tungsten-boron and cobalt-tin-boron among others.

The metal electroless solutions described herein are generally applied to the substrate surface for between about 30 seconds and about 180 seconds at a composition temperature between about 60° C. and about 90° C. The electroless solution is generally provided at a flow rate between about 50 ml/min and about 2000 ml/min. In one embodiment of the present invention, a total application of between about 120 ml and about 200 ml of electroless solution was provided to deposit the electroless layer. The electroless solution generally provides for the deposition of a metal layer to a thickness of about 500 Å or less, such as between about 300 Å and about 400 Å.

An example of a cobalt electroless composition for forming a cobalt layer includes about 20 g/L of cobalt sulfate, about 50 g/L of sodium citrate, about 20 g/L of sodium hypophosphite, with sufficient potassium hydroxide to provide a pH of between about 9 and about 11 for the composition, which is applied to the substrate surface for about 120 seconds at a flow rate of about 750 ml/min at a composition temperature of about 80° C. A cobalt-tungsten layer is deposited by the addition of about 10 g/L of sodium tungstate.

An example of a cobalt electroless composition for forming a cobalt layer with a borane-containing reducing agent includes about 20 g/L of cobalt sulfate, about 50 g/L of sodium citrate, about 4 g/L of dimethylamineborane, with sufficient potassium hydroxide to provide a pH of between about 10 and about 12 for the composition, which is applied to the substrate surface for about 120 seconds at a flow rate of about 750 ml/min at a composition temperature of about 80° C. A cobalt-tungsten-boron layer is deposited by the addition of about 10 g/L of sodium tungstate.

Borane-containing reducing agents in the metal electroless deposition process allow electroless deposition on exposed conductive material without the need for an initiation layer. When an initiation layer is first deposited on the substrate surface prior to the metal electroless deposition, the process is typically performed in two processing chambers. When the metal electroless deposition process occurs without the initiation layer, such as with the use of borane-containing reducing agents in the metal electroless deposition, the electroless process can be performed in one chamber.

Additionally, the method of depositing the material from an electroless solution, whether the initiation layer or metal layer, may include applying a bias to a conductive portion of the substrate structure if available (i.e. a seed layer), such as a DC bias, during the electroless deposition process.

The initiation layer and/or metal passivating layer may be annealed (i.e., heated) at a temperature between about 100° C. to about 400° C. The anneal may be performed in a vacuum or in a gas atmosphere, such as a gas atmosphere of one or more noble gases (such as Argon, Helium), nitrogen, hydrogen, and mixtures thereof.

Suitable apparatus for performing electroless deposition processes include an Electra Cu™ ECP processing platform or Link™ processing platform that are commercially available from Applied Materials, Inc., located in Santa Clara, Calif. The Electra Cu™ ECP platform, for example, includes an integrated processing chamber capable of depositing a conductive material by an electroless process, such as an electroless deposition processing (EDP) cell, which is commercially available from Applied Materials, Inc., located in Santa Clara, Calif. The Electra Cu™ ECP platform generally includes one or more electroless deposition processing (EDP) cells as well as one or more pre-deposition or post-deposition cell, such as spin-rinse-dry (SRD) cells, etch chambers, or annealing chambers.

Suitable apparatus for deposition of dielectric films are the Producer™ CVD and PECVD systems, available from Applied Materials, Inc., located in Santa Clara, Calif. The Producer™ systems use a multichamber architecture in a design that transfers wafers in pairs to process modules; each module has two identical chambers that use common vacuum and gas delivery subsystems. In addition to handling the full range of conventional dielectric CVD and PECVD applications, the Producer™ system deposits DARC™, damascene nitride and low k films such as TEOS FSG, Black Diamond™ and BLOk™ (Barrier Low k).

Etching processes, including dry etch and plasma etch, can be carried out on an eMax™ etching system available from Applied Materials, Inc., located in Santa Clara, Calif. The system includes a low pressure/high gas flow regime, controllable magnetic field, and high rf power capability. The eMax™ system integrates etch, photoresist strip and barrier removal steps on a single system. Etch rates of over 6000 angstroms/min. is possible. Wet etch or wet cleaning processes can be accomplished on an Oasis Clean™ system, also available from Applied Materials, Inc., CA. The apparatus uses both ultrasonic cleaning and wet chemical cleaning processes to clean substrate surfaces.

A suitable integrated controller and polishing apparatus is the Mirra™ with iAPC or Mirra Mesa™ with iAPC, also available from Applied Materials, Inc., CA.

Figure 2:
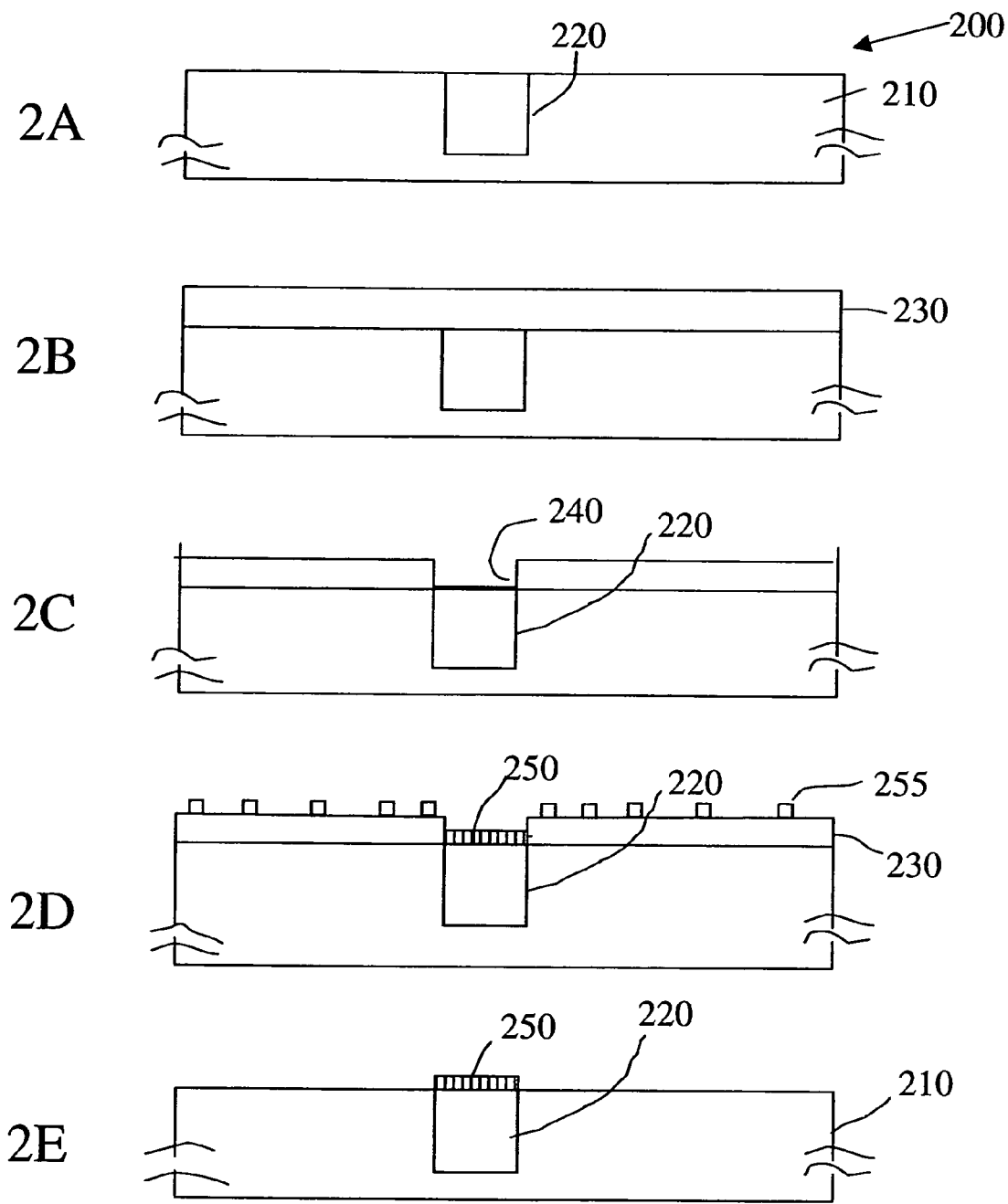
FIGS. 2–4 are schematic illustrations of exemplary deposition processes for the selective deposition of a conductive passivating layer according to one or more exemplary embodiments of the present invention.

FIGS. 2A–2E illustrate an exemplary process for selective metal encapsulation of a conductive element according to one or more embodiments of the present invention. Device 200 is shown in FIG. 2A having a substrate 210 containing conductive element 220 therein. The features of device 200 represent only a portion of the device and the actual device may include additional layers and/or additional device features. Furthermore, the conductive element is represented in cross-section as a trench, however, is it within the scope of the invention for the conductive element to comprise a variety of shapes or forms and to perform a variety of functions. By way of example only, the conductive element can be an interconnect feature such as a plug, via, trench, contact, line, wire, and may also form part of a metal gate electrode. It can also be a metal film covering a substantial portion of the substrate surface. The conductive element is made up of a conductive material, e.g., a metal having high conductivity, for example, copper.

The metallic conductive element is formed in the substrate using, for example, selective electroless metallization, in which the conductive metal is catalytically deposited from a metal ion solution without the application of an electrical current. Because the conductive metals, and copper in particular, tend to diffuse into adjacent dielectric materials such as $SiO_2$, it is common practice to line the via opening 220 with a diffusion barrier layer (not shown) such as titanium nitride, titanium tungsten, tantalum, tantalum nitride and tungsten nitride. In addition, the diffusion barrier layer is activated, for example by the deposition of a seed layer of palladium or displacement reaction with copper, to promote the autocatalytic deposition of copper. Other methods of metallic deposition include physical vapor deposition methods such as sputter deposition from the appropriate target. CMP techniques are used to polish away unwanted conductive metal and to prepare the substrate for deposition of the passivating layer.

The surface can be further treated to clean the substrate surface of contaminants using techniques known in the art. Wet etching techniques using HF solution and dry etch techniques using HF vapor are suitable for removing dielectric materials, such as silicon oxide, from the substrate surface. Other etching techniques include downstream or remote plasma etching using a hydrogen and water plasma or a hydrogen plasma and in situ etch processes using hydrogen, hydrogen and nitrogen, or ammonia to remove metal oxides from the substrate surface. CMP is suitable for removal of various materials, including metals and dielectric materials. Other exemplary surface treatments include cleaning with an acidic solution to remove metal oxides and other contaminants from the substrate surface. The exposed conductive feature can also be rinsed with distilled water to remove residual contaminants from the surface treatment process.

After substrate surface preparation, a sacrificial protective layer 230 is deposited on the substrate surface, as is illustrated in FIG. 2B. The protective layer can be deposited by any method that is compatible with the device fabrication process and can be made up of any material that can be incorporated into the device fabrication process without detriment to the subsequent processing steps.

In exemplary embodiments, the protective layer is a photoresist, which can be applied to the substrate as a spin-on layer at a thickness of about 1000 Å to about 5000 Å. Subsequently, the photoresist is exposed and developed to define one or more openings 240 that provides access to the underlying conductive element(s) 220, as is shown in FIG. 2C. A thin layer 250 of passivation material is deposited on conductive element 220 by electroless deposition as described above and as shown in FIG. 2D. The passivating layer can be less than about 400 Å and can have a thickness in the range of about 30 Å to about 300 Å in at least some embodiments. The passivating layer may be deposited in two steps by first depositing an initiation layer, followed by depositing a conductive passivating layer. Alternatively, the passivating layer may be deposited in a single step directly onto the conductive element. Regardless of the method of passivating layer deposition, random nucleation sites 255 of the passivating metal also form on the protective layer 230. In a subsequent step shown in FIG. 2E, the photoresist 230 is lifted off of the substrate surface so that unwanted nucleation sites 255 are removed and the passivating layer 250 remains only on the conductive element 220. The photoresist is removed by conventional processes, such as wet etch or ashing, that is selected to remove the photoresist without negative effect on the underlying intermediate layer (s) or substrate surface. The substrate can be cleaned using wet solvent that does not dissolve the passivating layer. The device is then further processed consistent with its intended function.

The above procedure is attractive because it does not require the use of a high k dielectric material adjacent to the conductive element. Low k materials, e.g., polyarylethers, fluorinated polyarylethers, polyimides and fluorinated polyimides, benzocyclobutenes, carbon-doped oxides, organic and inorganic porous low k materials and hybrids thereof, and the like, can be directly applied to the substrate surface after completion of the processing steps set forth in FIGS. 2A–2E to provide improved electrical isolation between adjacent conductive regions of an integrated circuit that is advantageous in many semiconductor devices.

In another exemplary embodiment, the protective layer 230 is a dielectric barrier layer such as an etch stop layer. Exemplary etch stop materials include SiN or SiOC available from Applied Materials, Inc., located in Santa Clara, Calif., under the tradename Blok™. The etch stop layer (or other dielectric) is deposited as a thin layer, e.g., about 50 Å, over the substrate surface by, for example, PECVD or spin-on polymer deposition. Alternatively, a thick layer of dielectric material is deposited and is etched or polished back to a very thin protective layer, for example about 50 Å. The thinness of the protective layer is chosen to reduce the amount of high k material deposited on the metallic conductive element and thereby reduce interlayer capacitance. The conductive element is exposed by removing, i.e., etching, the dielectric layer in those areas not protected by a photomask (not shown) to define one or more openings 240 that exposes the underlying conductive element 220, as is shown in FIG. 2C. A passivating layer 250 is deposited as described above. The dielectric barrier (protecting layer) or at least a portion of the protecting layer is then removed along with surface contaminates 255. In one or more other exemplary embodiments, only a portion of the dielectric layer is removed (sufficient to remove stray electrolessly deposited sites 255), and additional dielectric material is deposited on the remaining dielectric layer to a final thickness. The final thickness is desirably low to minimize the effects of the high k material, and can be in the range of about 600 Å. The device is then further processed consistent with its intended function.

In another embodiment of the present invention, the protective layer 230 is an amorphous carbon layer. In one or more embodiments, the amorphous carbon layer is deposited onto the substrate surface, for example, by CVD or spin-on polymer deposition to a thickness of about 100 Å to about 5000 Å. The conductive element is exposed by masking the amorphous carbon film and developing the photoresist to expose the underlying amorphous carbon film. The carbon film is then removed, e.g., by etching, in those areas not protected by the photomask (not shown) to define one or more openings 240 that exposes the underlying conductive element(s) 220, as is shown in FIG. 2C. A passivating layer 250 is deposited as described above. The amorphous carbon layer is then removed along with surface contaminates 255 to eliminate stray electrolessly deposited passivation material (and other contaminants). Amorphous carbon can be removed by ashing, plasma ashing and wet or dry chemical etching. As with the use of a photoresist, the process results in the complete removal of the amorphous carbon film, so that no high k dielectric material remains adjacent to the conductive elements. The device is then further processed consistent with its intended function.

Figure 3:
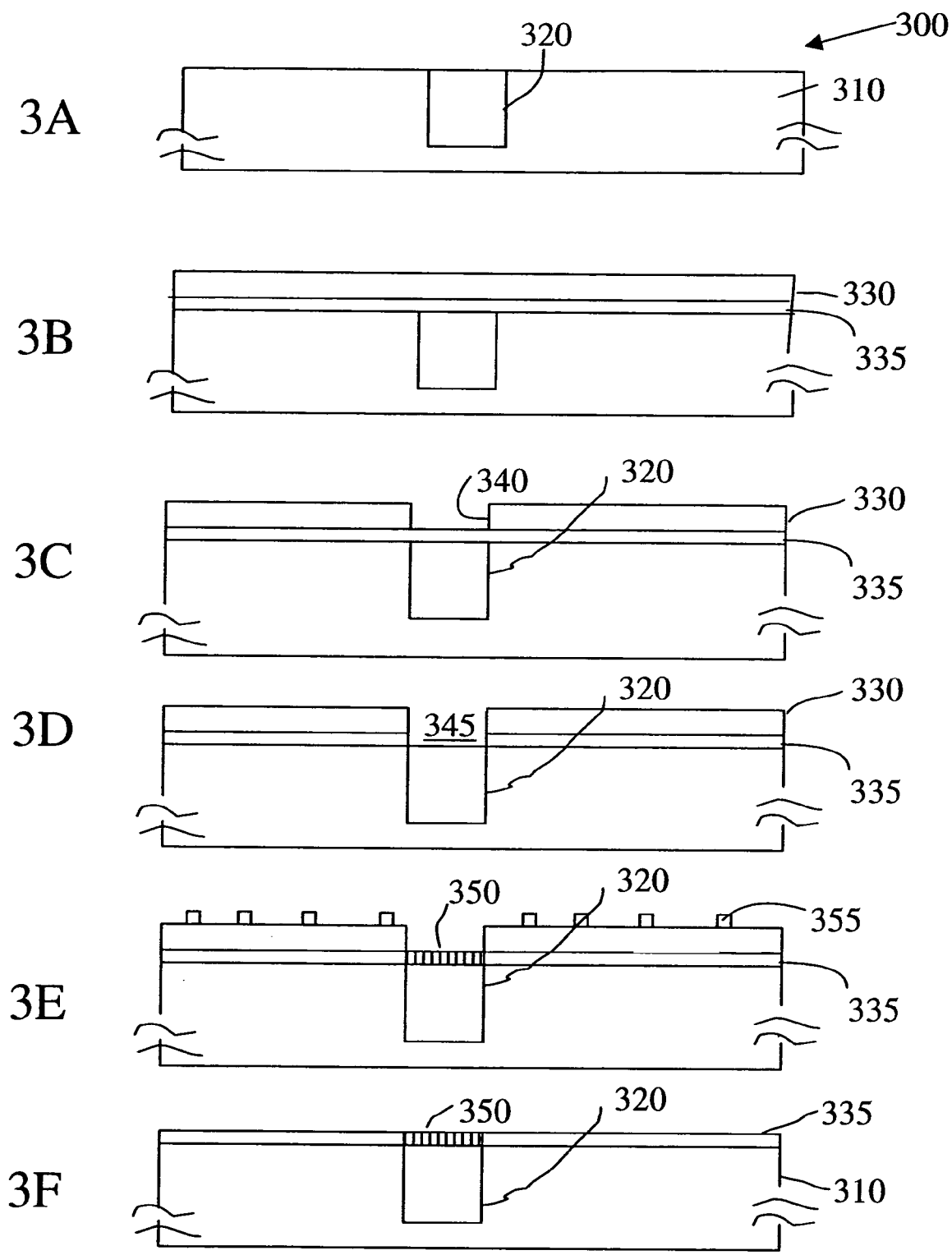

In another exemplary embodiment of the present invention, intermediate layers may be deposited between the substrate surface and the protective layer. FIGS. 3A–3F illustrate an exemplary process for such an integration scheme using a conductive passivating layer. Device 300 is shown in FIG. 3A having a substrate 310 containing a conductive element 320 therein. As noted above, the features of device 300 represent only a portion of the device and the actual device may include additionally layers and/or additional device features.

A sacrificial protective layer 330 is deposited on the substrate surface, as is illustrated in FIG. 3B. Prior to deposition of the protective layer, one or more intermediate layer(s) 335 is deposited on the substrate surface. The protective and intermediate layers can be any of the materials and layers described above, and can be deposited according to any of the method described herein or any other conventional technique. In an exemplary embodiment, the protective layer is a photoresist and the intermediate layer is a dielectric material such as an etch stop.

As is shown in FIG. 3B, dielectric material 335 is deposited over the substrate surface 310, e.g., by PECVD or spin-on polymer deposition, to a thickness of about 50 to about 1000 Å. A photoresist layer 330 then is applied to the intermediate layer as a spin-on layer at a thickness of about 1000 Å to about 5000 Å. Subsequently, the photoresist is exposed and developed to define one or more openings 340 that exposes the underlying intermediate layer 335 above the conductive element 320, as is shown in FIG. 3C. The conductive element is exposed by removing, i.e., etching, the dielectric layer in those areas not protected by a protective layer 330 to define one or more openings 345 that exposes the underlying conductive element 320, as is shown in FIG. 3D. In one or more embodiments of the present invention, the etch is selective for the intermediate layer 335, so that protective layer 330 is not affected by the etch process. In one or more embodiments, the photomask is removed only after etching of both the protective and intermediate layers.

A thin layer 350 of passivation material is deposited on conductive element 320 by electroless deposition as described above and as shown in FIG. 3E. The passivating layer can be less than about 400 Å, and has a thickness in the range of about 30 Å to about 300 Å in exemplary embodiments. The passivating layer 350 can be of the same or different thickness as the dielectric layer 335. The passivating layer may be deposited in two steps by depositing an initiation layer, followed by depositing the conductive passivating layer. Alternatively, the passivating layer may be deposited in a single step directly onto the conductive element. Regardless of the method of passivating layer deposition, random nucleation sites 355 of the passivating metal also form on the protective layer. In a subsequent step shown in FIG. 3F, the protective layer 330 (e.g., photoresist), including unwanted nucleation sites 355, is lifted off of the substrate surface, leaving the passivating layer 350 only on the conductive element 320. The photoresist is removed by conventional processes, such as wet etch or ashing, that is selected to remove the photoresist without negative effect on the underlying dielectric materials of the intermediate layer (s) or substrate surface. Upon removal of the photoresist layer, dielectric layer 335 covers the remaining surface of the substrate 310. In those embodiments where the dielectric layer 335 and the passivating layer 350 are of the same thickness, a smooth planar substrate surface containing the passivating layer embedded in a dielectric is obtained, as illustrated in FIG. 3F. The substrate can be cleaned using wet solvent that does not dissolve the passivating layer. The device is then further processed consistent with its intended function.

Figure 4:
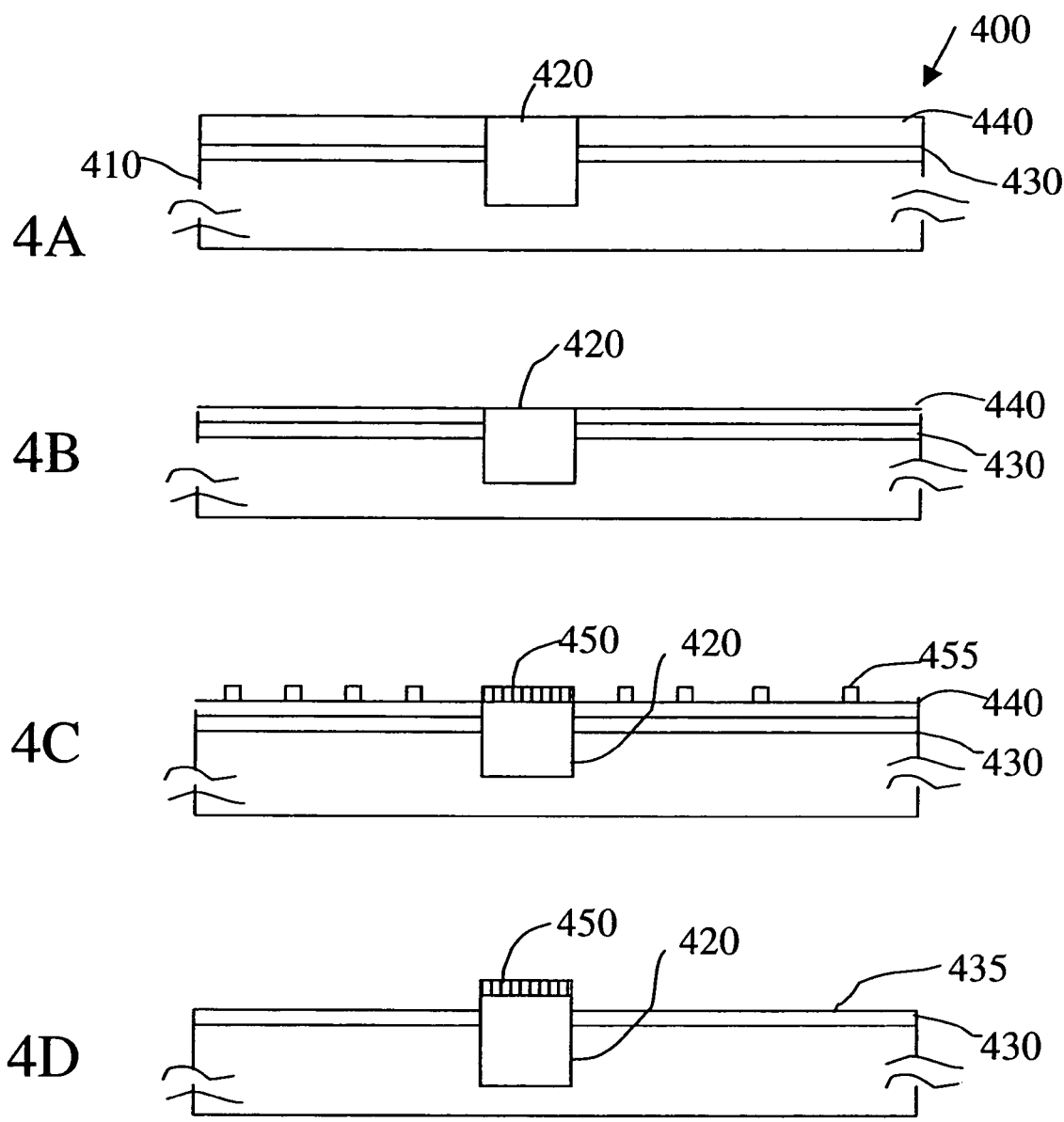

FIGS. 4A–4D illustrate still another embodiment of the present invention. FIG. 4A shows a device 400 including a first lower layer 430 of a first dielectric material and a second upper layer 440 of a second dielectric material deposited on a substrate 410. The device also includes a conductive element 420 embedded in the second dielectric/first dielectric/substrate composite. The layers are deposited and processed using conventional methods. The first and second materials of dielectric layers 430, 440 are selected to have different etching chemistries so that one layer is inert to etching under conditions that etch the other layer. Exemplary first and second dielectric materials include organic dielectrics such as organic low k materials and inorganic dielectrics such as carbon-doped oxides, SiOC, fluorine-doped silicon glass (FSG), and silicon oxide-based low k materials such as Black Diamond™ available from Applied Materials, Inc., located in Santa Clara, Calif. In an exemplary embodiment, the upper dielectric layer 440 is an organic low k material and the lower dielectric layer 430 is a carbon-doped oxide. In one or more embodiments, the upper and lower dielectric materials are the same, and an intermediate surface is treated to alter the etching characteristics of the layer. Exemplary treatments that alter etching properties of the layer include inert gas plasma treatments. The surface treated substrate acts as an etch stop. The surface treatment can be applied in a separate step or as an integral part of the deposition process for dielectric layers.

Referring to FIG. 4B, the device is processed by CMP to remove a portion of the upper dielectric layer 440 and conductive element 420 from the substrate surface. In an exemplary embodiment, the dielectric layer 440 has a thickness of about 100 Å to about 400 Å after CMP processing. The surface is then cleaned as described above, for example, with an acid bath to remove residual traces of metal on the substrate surface. Subsequently, a passivating layer is deposited on the substrate surface using electroless deposition as described herein. The resultant layer forms a continuous passivating layer 450 on the conductive element and random discontinuous islands 455 of passivation material on the dielectric layer 440, as is shown in FIG. 4C. The device is then exposed to an etchant that selectively removes the remaining traces of dielectric layer 440. The final device includes a clean dielectric layer 430 in which a conductive metal layer 450 is embedded. In one or more embodiments, the metallic passivating layer (and a portion of the conductive element) may extend above the plane of the substrate surface. The device is then further processed consistent with its intended function.

One or more embodiments of the present invention also contemplate methods of encapsulating a conductive element using a conductive passivating layer without the need for first depositing a sacrificial protective layer. According to one or more embodiments of the present invention, a conductive element is encapsulated without stray electoless deposition of passivating metal elsewhere on the substrate surface by depositing a layer of the passivation material over the entire substrate surface or a portion thereof containing the conductive element(s), masking the passivation layer to protect the underlying conductive element(s) and removing the unmasked passivation material from the substrate surface to reveal the underlying substrate or other underlying intermediate layers. One or more embodiments of the present invention contemplate the deposition of an intermediate layer onto the substrate surface prior to deposition of the metallic passivating layer. The mask is subsequently removed to obtain the selectively encapsulated metal device, in which the surrounding substrate surface areas are substantially free of contaminants arising from the deposition of the passivating layer.

Figure 5:
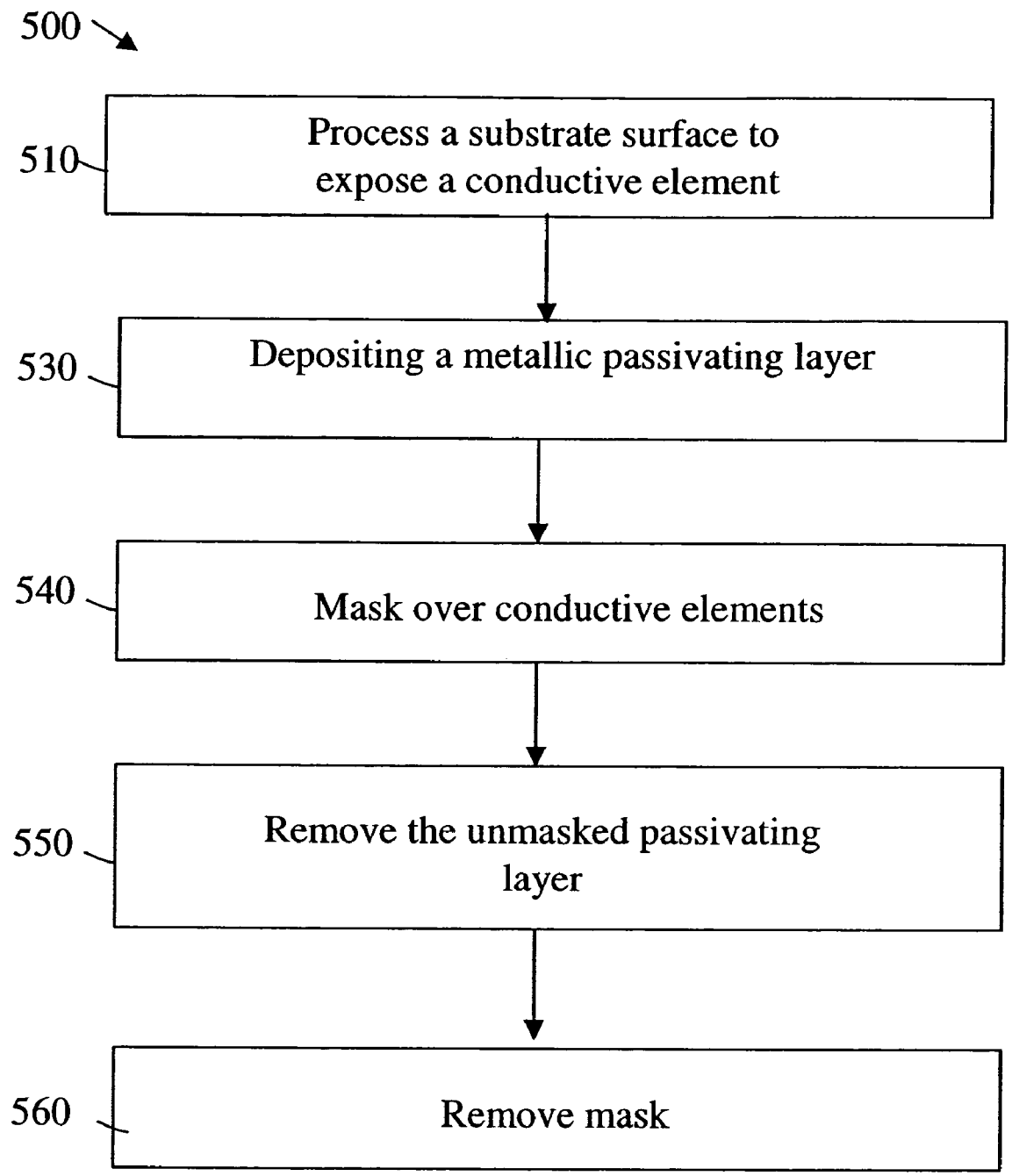
FIG. 5 is a flow chart illustrating the steps undertaken in selective metal encapsulation schemes according to one or more embodiments of the present invention.

FIG. 5 is a flow chart illustrating an exemplary processing sequence 500 undertaken in encapsulating a conductive element with conductive passivating layer according to one or more embodiments of the present invention.

In step 510 in FIG. 5, a substrate surface is prepared as previously described by treating the substrate surface so as to expose the conductive element. The substrate surface can be treated using materials removal and cleaning techniques known in the art. Exemplary materials removal techniques include chemical mechanical polishing (CMP) and etching. Wet etching techniques using HF solution and dry etch techniques using HF vapor are suitable for removing dielectric materials, such as silicon oxide, from the substrate surface. Other etching techniques include downstream or remote plasma etching using a hydrogen and water plasma or a hydrogen plasma and in situ etch processes using hydrogen, hydrogen and nitrogen or ammonia to remove metal oxides from the substrate surface. CMP is suitable for removal of various materials, including metals. Other exemplary surface treatments include ultrasonication and cleaning with an acidic solution to remove metal oxides and other contaminants from the substrate surface. The exposed conductive feature can also be rinsed with distilled water to remove residual contaminants from the surface treatment process.

A conductive passivating layer then is deposited on the substrate surface in step 530 of FIG. 5. The conductive passivation material is generally a metal that does not form a solid solution with copper or other conductive metals, such as ruthenium, tantalum, tungsten, cobalt, palladium, nickel, tin, titanium, molybdenum, platinum, iron, and niobium and their alloys. In one or more embodiments, the passivating conductive metal is cobalt or a cobalt alloy. One or more embodiments contemplate the deposition of the conductive passivation layer as a continuous film across the substrate surface. The continuous film is deposited, for example, physical deposition techniques such as sputter deposition using a suitable target.

In step 540 of FIG. 5, the passivating layer is masked in a pattern of the underlying conducting elements. The passivating layer can be masked with photoresist, which is developed to remove selected areas of the photoresist film so that the underlying conductive elements are protected and the surrounding dielectric regions are exposed. The photoresist can be a positive photoresist, in which case the exposed areas of a positive resist film are removed by the process of development. Alternatively, the photoresist can be a negative photoresist, in which case the mask pattern is a negative of the underlying conductive layer structure and the unexposed areas of the resist film are removed by the process of development.

In step 550 of FIG. 5, the exposed passivating layer is then etched to selectively remove the unmasked passivating layer and to expose the underlying substrate surface. Exemplary etching processes for removal of cobalt includes etching at elevated temperatures, e.g., of greater than 120° C., using Cl$_2$ gas, and including CO, CF$_4$ or N$_2$ gas for passivation. The etching process is selective for the metallic passivation material and leaves the substrate surface free of passivation material (and other contaminants) without deleterious effect to the substrate, i.e., the dielectric regions or conductive elements of the substrate.

The protective mask is then removed or lifted to expose the encapsulating passivating layer, as is shown in step 560. Materials removal techniques known in the art can be used. Wet etching and ashing can be used for the removal of the photoresist. The device also can be rinsed with distilled water to remove residuals from the materials removal process.

Figure 6:
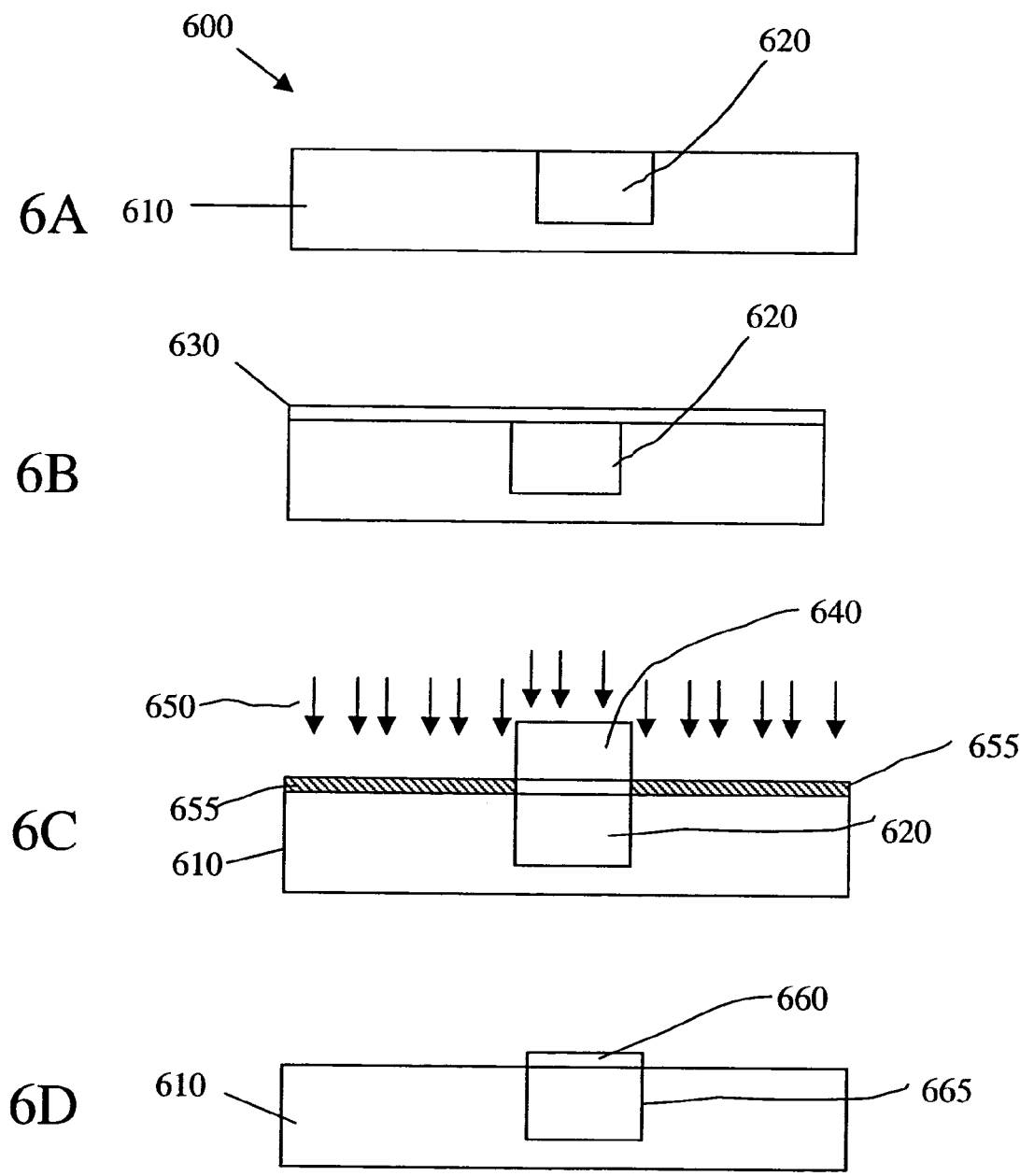
FIG. 6 is a schematic illustration of an exemplary integration scheme for deposition of a selective metal encapsulation layer according to one or more embodiments of the present invention.

FIGS. 6A–6D illustrate an exemplary process for selective metal encapsulation of a conductive element according to one or more embodiments of the present invention. Device 600 is shown in FIG. 6A having a substrate 610 containing conductive element 620 therein. As above, the features of device 600 illustrate only a portion of the device and the actual device may include additional layers and/or additional device features. The metallic conductive element can be prepared as previously described or according to known methods in the art.

A thin layer 630 of passivation material is deposited as a continuous layer on substrate surface 610 as shown in FIG. 6B, thereby encapsulating at least the conductive element 620. The passivating layer can cover the entire substrate surface, or a selected region thereof; however, the deposited passivating layer should cover at least the conductive element(s). The passivating layer can be less than about 400 Å and has a thickness in the range of about 30 Å to about 300 Å in some embodiments. The passivating layer can be deposited using physical vapor deposition techniques such as sputtering. In sputtering, a target of a composition commensurate with the desired composition of the passivating layer is bombarded with a sputtering gas, typically an inert gas, to remove atoms from the target, which are then deposited on the substrate surface. A suitable apparatus for sputter deposition is the Endura™ processing system, available from Applied Materials, Inc., located in Santa Clara, Calif.

A photoresist 640 is deposited and developed as shown in FIG. 6C to mask the underlying conductive element 620 of the substrate surface. The photoresist can be applied to the substrate as a spin-on layer and developed using conventional techniques. The surface is then etched as shown by arrows 650 to remove exposed passivation material 655 and to uncover the underlying regions of the substrate surface 610. Exemplary etch process suitable for metals etching include the use of decoupled plasma source (DPS) technology. Suitable apparatus for metal etching of cobalt (or other passivating metals) includes the Centura System using Metal Etch DPS processing platform, available from Applied Materials located in Santa Clara, Calif.

In a subsequent step shown in FIG. 6D, the photoresist 640 is lifted off to reveal passivating layer 660 and to provide a passivating layer-encapsulated conductive element 665 in which the surrounding substrate surface is substantially free of surface contaminations.

Although various embodiments that incorporate the teachings of the present invention have been shown and described in detail herein, those skilled in the art can readily devise many other varied embodiments that incorporate these teachings, including embodiments with numerical values and ranges differing from those set forth herein. It is appreciated that the figures and discussion herein illustrate only a portion of an exemplary semiconductor device. Thus, the present invention is not limited to only those structures described herein.

What is claimed is:

1. A method of processing a semiconductor substrate, comprising the steps of:
   depositing a protective layer on a topographically substantially flat substrate surface comprising an exposed conductive element;
   selectively removing a portion of the protective layer to expose the conductive element of the substrate surface;
   selectively electrolessly depositing a metallic passivating layer onto the exposed conductive element, wherein discontinuous regions of stray metallic passivating material are also deposited on the protective layer; and
   removing at least a portion of the protective layer from the substrate after deposition of the metallic passivating layer, wherein the stray metallic passivating material deposited on the protective layer is also removed.

2. The method of claim 1, wherein the substrate surface comprises a dielectric material in which the conductive element is disposed.

3. The method of claim 1, wherein the substrate surface comprises a low k dielectric material.

4. The method of claim 1, wherein a portion of the thickness of the protective layer is removed.

5. The method of claim 1, wherein the entire thickness of the protective layer is removed.

6. The method of claim 1, wherein the step of depositing a protective layer is accomplished using a technique selected from the group consisting of chemical vapor deposition (CVD), plasma enhance chemical vapor deposition (PECVD), spin on deposition and physical vapor deposition.

7. The method of claim 1, wherein the protective layer comprises an organic material.

8. The method of claim 7, wherein the organic material of the layer is selected from the group consisting of photoresist and amorphous carbon.

9. The method of claim 8, wherein the steps of depositing and processing the photoresist protective layer comprise the steps of:
   depositing a photoresist over the substrate surface; and
   exposing and developing the photoresist under conditions that do not degrade the substrate surface to expose a selected region of an underlying layer.

10. The method of claim 9, wherein the exposed and developed photoresist is removed after deposition of the metallic passivating layer by ashing or wet chemical etch.

11. The method of claim 8, wherein the steps of depositing and processing the amorphous carbon protective layer comprise the steps of:
   depositing an amorphous carbon layer over the substrate surface; and
   etching the amorphous carbon layer under conditions that do not degrade the substrate surface.

12. The method of claim 11, wherein the amorphous carbon layer is removed after deposition of the metallic passivating layer by ashing or reactive ion etch.

13. The method of claim 1, wherein the protective layer comprises a dielectric material.

14. The method of claim 13, wherein steps of depositing and processing the dielectric protective layer comprise the steps of:
   depositing a dielectric layer over the substrate surface; and
   selectively etching the dielectric layer under conditions that do not degrade the substrate surface.

15. The method of claim 14, wherein the dielectric protective layer is removed after deposition of the passivating layer by etching using a technique selected from the group consisting of wet etch, dry etch, reactive ion etch and plasma etch.

16. The method of claim 1, where steps for depositing and processing the protective layer comprise the steps of:
depositing an intermediate layer on the substrate surface;
depositing a protective layer on the intermediate layer;
selectively removing the protective layer to expose the intermediate layer; and
selectively removing the intermediate layer under conditions that do not degrade the conductive element.

17. The method of claim 16, wherein the intermediate layer comprises an etch stop and the protective layer comprises a photoresist.

18. The method of claim 16, wherein the intermediate layer comprises a dielectric material.

19. The method of claim 1, wherein the conductive material comprises copper.

20. The method of claim 1, wherein the passivating layer is selected from the group consisting of ruthenium, tantalum, tungsten, cobalt, palladium, nickel, tin, titanium, molybdenum, platinum, iron, and niobium, and alloys thereof.

21. The method of claim 1, wherein the step of electrolessly depositing a metallic passivating layer comprises the steps of:
depositing an initiation layer on the first conductive material by exposing the substrate to an activation solution;
cleaning the substrate after deposition of the initiation layer; and
depositing a metallic passivating layer on the initiation layer by exposing the initiation layer to an electroless solution.

22. A method of processing a semiconductor substrate, comprising:
steps for depositing a protective layer on a topographically substantially flat substrate surface comprising an exposed conductive element disposed in a dielectric material;
steps for processing the protective layer to expose the conductive element;
steps for selectively electrolessly depositing a metallic passivating layer onto the conductive element, wherein discontinuous regions of stray metallic passivating material are also deposited on the protective layer; and
steps for removing at least a portion of the protective layer from the substrate after electroless deposition, wherein the stray metallic passivating material deposited on the protective layer is also removed.

23. The method of claim 22, wherein the step of depositing a metallic passivating layer comprises the steps of:
steps for depositing an initiation layer on the first conductive material by exposing the substrate to an activation solution;
steps for cleaning the substrate after deposition of the initiation layer; and
steps for depositing a metallic passivating layer on the initiation layer by exposing the initiation layer to an electroless solution.

24. The method of claim 22, where steps for depositing and processing the protective layer comprise the steps of:
steps for depositing an intermediate layer on the substrate surface;
steps for depositing a protective layer on the intermediate layer;
steps for exposing and developing the protective layer to expose the intermediate layer; and
steps for etching the intermediate layer under conditions that do not degrade the conductive element.

25. The method of claim 22, wherein steps for depositing and processing an amorphous carbon protective layer comprise the steps of:
steps for depositing an amorphous carbon layer over the substrate surface; and
steps for etching the amorphous carbon layer under conditions that do not degrade the conductive element.

26. The method of claim 22, wherein the steps for depositing and processing a photoresist protective layer comprise the steps of:
steps for depositing a photoresist over the substrate surface; and
steps for exposing and developing the photoresist under conditions that do not degrade the conductive element.

27. The method of claim 22, wherein the steps of depositing and processing a dielectric protective layer comprise the steps of:
steps for depositing a dielectric protective layer over the substrate surface; and
steps for etching the dielectric protective layer under conditions that do not degrade the conductive element.

28. A system for processing a semiconductor substrate, comprising:
means for depositing a protective layer on a topographically substantially flat substrate surface comprising an exposed conductive element disposed in a dielectric material;
means for processing the protective layer to expose the conductive element;
means for selectively electrolessly depositing a metallic passivating layer onto the conductive element, wherein discontinuous regions of stray metallic passivating material are also deposited on the protective layer; and
means for removing at least a portion of the protective layer from the substrate after electroless deposition, and for removing the stray metallic passivating material deposited on the protective layer.

29. The system of claim 28, wherein the steps for depositing and processing a photoresist protective layer comprises the steps of:
means for depositing a photoresist over the substrate surface; and
means for exposing and developing the photoresist under conditions that do not degrade the conductive element.

30. The system of claim 28, wherein the step of electrolessly depositing a metallic passivating layer comprises the steps of:
means for depositing an initiation layer on the first conductive material by exposing the substrate to an activation solution;
means for cleaning the substrate after deposition of the initiation layer; and
steps for depositing a metallic passivating layer on the initiation layer by exposing the initiation layer to an electroless solution.

31. The system of claim 26, where steps for depositing and processing the protective layer comprises the steps of:
means for depositing an intermediate layer on the substrate surface;
means for depositing a protective layer on the intermediate layer;
means for exposing and developing the protective layer to expose the intermediate layer; and means for etching the intermediate layer under conditions that do not degrade the conductive element.

32. The system of claim 26, wherein steps for depositing and processing an amorphous carbon protective layer comprises the steps of:
   means for depositing an amorphous carbon layer over the substrate surface; and
   means for etching the amorphous carbon layer under conditions that do not degrade the conductive element.

33. The system of claim 26, wherein depositing and processing a dielectric protective layer comprises:
   means for depositing a dielectric layer over the substrate surface; and
   means for etching the dielectric layer under conditions that do not degrade the conductive element.

* * * * *